(12) United States Patent
Yoshikawa et al.

(10) Patent No.: US 6,267,123 B1
(45) Date of Patent: Jul. 31, 2001

(54) POD AND METHOD OF CLEANING IT

(75) Inventors: Noriaki Yoshikawa; Tadashi Yotsumoto; Terumi Muguruma; Yoshitaka Hasegawa; Yuichi Kuroda, all of Kanagawa-ken (JP)

(73) Assignee: Kabushiki Kaisha Toshiba, Kawasaki (JP)

(*) Notice: Subject to any disclaimer, the term of this patent is extended or adjusted under 35 U.S.C. 154(b) by 0 days.

(21) Appl. No.: 09/265,539

(22) Filed: Mar. 9, 1999

(30) Foreign Application Priority Data

Mar. 23, 1998 (JP) .................................................. 10-074632

(51) Int. Cl.[7] ........................................................ B08B 3/02
(52) U.S. Cl. ........................ 134/62; 134/104.1; 134/902; 134/166 R
(58) Field of Search .................................. 134/62, 68, 76, 134/105, 166 R, 169 R, 182, 902, 104.1

(56) References Cited

U.S. PATENT DOCUMENTS

| | | | |
|---|---|---|---|
| 5,238,503 | * | 8/1993 | Phenix et al. ................... 134/167 R |
| 5,301,700 | * | 4/1994 | Kamikawa et al. . |
| 5,363,867 | * | 11/1994 | Kawano et al. . |
| 5,445,171 | * | 8/1995 | Ohmori et al. ........................ 134/902 |
| 5,470,392 | * | 11/1995 | Yamada et al. ............................ 134/2 |
| 5,482,068 | * | 1/1996 | Kithahara et al. . |
| 5,603,777 | * | 2/1997 | Ohshi .................................... 134/140 |
| 5,621,982 | * | 4/1997 | Yamashita et al. . |
| 5,711,821 | * | 1/1998 | Turner et al. . |
| 5,715,851 | * | 2/1998 | Jung et al. . |
| 5,746,008 | * | 5/1998 | Yamashita et al. . |
| 5,766,061 | * | 6/1998 | Bowers . |
| 6,017,397 | * | 1/2000 | Doran . |
| 6,039,057 | * | 3/2000 | Doran . |
| 6,096,100 | * | 8/2000 | Guldi . |

FOREIGN PATENT DOCUMENTS 64-12534 * 1/1989 (JP) .

* cited by examiner

*Primary Examiner*—Frankie L. Stinson
(74) *Attorney, Agent, or Firm*—Finnegan, Henderson, Farabow, Garrett & Dunner, L.L.P.

(57) ABSTRACT

A pod for storing and carrying substrates consists of a pod body and a cover. An inlet and an outlet are formed on one of the pod body and cover. The cover is tightly fitted to the pod body to close the inside of the pod body. A washing liquid is introduced into the pod through the inlet and is discharged from the pod through the outlet, thereby easily washing the inside of the pod with the pod itself serving as a washing tank. A washing cover has an inlet, an outlet, and a heater. The washing cover is attached to the pod body when washing the inside of the pod body. Further provided is a cleaning apparatus having pipes and a pump that are connected to the washing cover. The cleaning apparatus may have a table serving as the washing cover. The table is connected to pipes and a pump.

12 Claims, 26 Drawing Sheets

FIG.2A
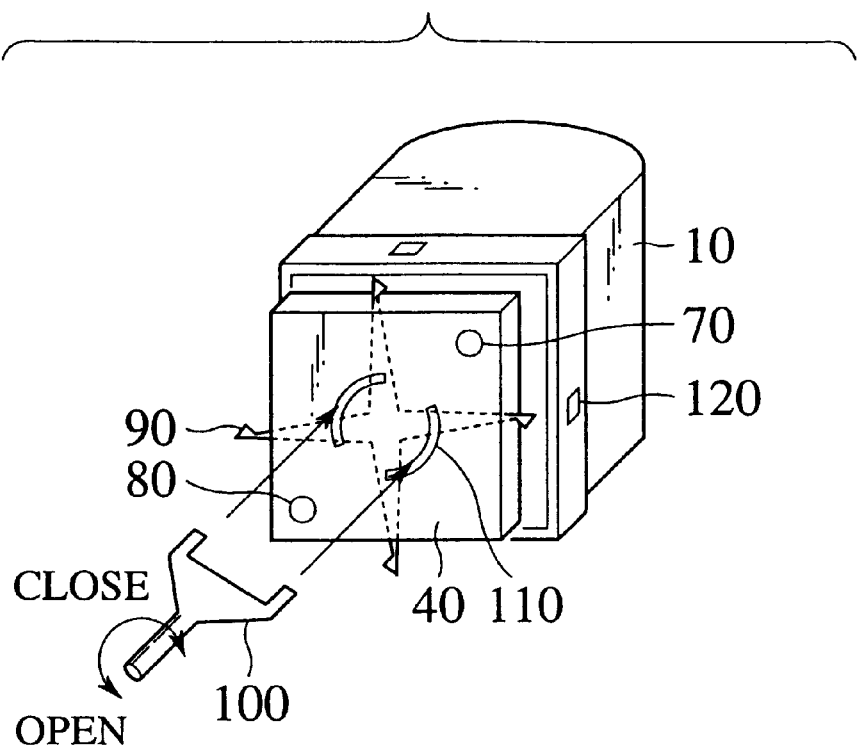
FIG.2B
FIG.2C
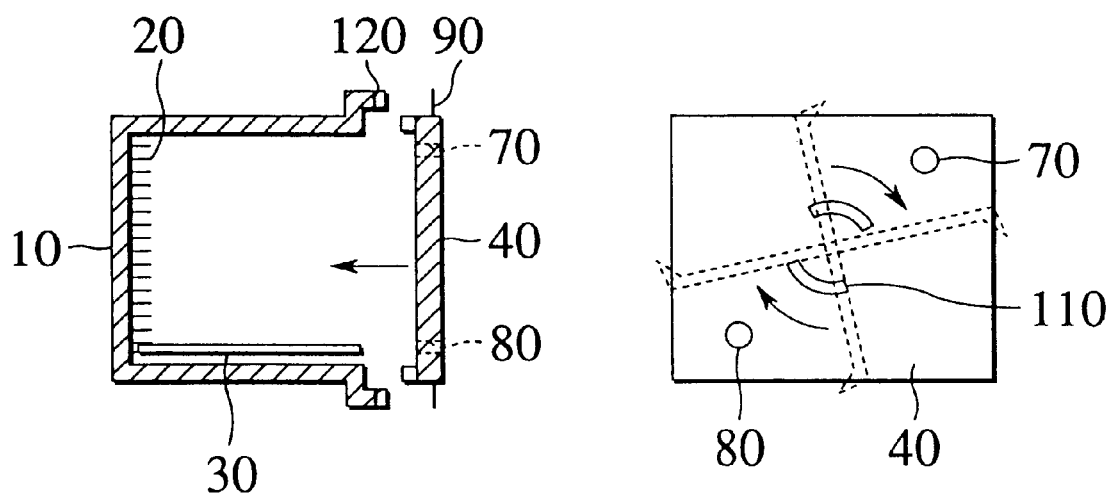

POD AND METHOD OF CLEANING IT

BACKGROUND OF THE INVENTION

1. Field of the Invention

The present invention relates to a pod used to store and carry substrates or wafers, and particularly, to the structure of a pod that is easy to clean, a method of cleaning a pod, an apparatus for cleaning a pod, and an apparatus for processing substrates.

2. Description of the Related Art

Generally, substrates or wafers made of, for example, silicon (Si) are stored and carried in wafer cassettes during manufacturing. Each wafer cassette carries 13 or 25 wafers. The wafer cassettes with wafers are transferred between processing apparatuses such as film forming and etching apparatuses during manufacturing. A wafer/substrate transferring system that employs the wafer cassettes is called a cassette-to-cassette system.

FIG. 25A shows a conventional open-type wafer cassette 800. The cassette 800 consists of a top plate 820, a bottom plate 810, and three posts that support the top and bottom plates 820 and 810. The posts 830 have grooves for supporting wafers, and the post 840 serves as a stopper for preventing the wafers from dropping.

In place of such wafer cassettes, pods have been studied to store and carry substrates or wafers, to meet needs for highly integrated fine devices to be produced from the substrates or wafers.

FIGS. 25B, 25C, and 25D show pods presently studied. Each pod consists of a pod body and a cover. The pod body is a box having an opening for taking in and out wafers, and the cover closes the opening of the pod body. The pod of FIG. 25B has a bottom opening that is closed by a cover 920. The pods of FIGS. 25C and 25D have side openings that are closed by covers 921 and 922, respectively. The pods of FIGS. 25B and 25D store the conventional open-type wafer cassettes with wafers. The pod of FIG. 25C has grooves on the inner wall thereof, to directly hold wafers without a wafer cassette.

The pods are capable of storing and carrying wafers in a closed dust-free space, thereby improving the yield of semiconductor products to be produced from the wafers.

Recent wafers are large in diameter, size, and weight to improve productivity. For these large wafers, the conventional wafer cassettes involve a risk of dropping the wafers during carriage, and therefore, the pods are preferable for such large wafers.

The pods are advantageous in keeping dust-free environment for wafers and securing safe carriage. The pods, however, have some problems. This will be explained.

The open wafer cassettes can be washed while holding wafers. On the other hand, wafers stored in closed pods are unable to wash. To wash them, they must be taken out of the pods. This means that the pods themselves are rarely washed during wafer processing.

As a result, the insides of the pods are gradually contaminated. This deteriorates the cleanliness of wafers stored therein, thereby lowering the yield of semiconductor products to be produced from the wafers.

The pods may be washed separately from the wafers during wafer processing. To wash large pods that store 200-mm to 300-mm diameter wafers, a large washing tank is needed. FIG. 26A shows a washing tank 950 for washing a pod 911. The tank 950 must be larger than the pod 911, and if the pod 911 is large, the tank 950 must be very large. FIG. 26B shows a pod washing apparatus having a washing tank 960 and a dryer chamber 980. This apparatus is very large. In a limited space in a clean room, such a large apparatus is hardly acceptable.

SUMMARY OF THE INVENTION

An object of the present invention is to provide a pod that is easy to clean, a method of cleaning a pod, an apparatus for cleaning a pod, and a semiconductor processing apparatus having a pod cleaning system.

In order to accomplish the object, a first aspect of the present invention provides a pod for storing substrates, having a pod body provided with an opening for taking in and out the substrates, a cover removably attached to the opening, and a fixing unit for fixing the pod body and cover together to tightly close the pod body. The cover has an inlet for introducing fluid into the pod and an outlet for discharging the fluid from the pod.

The first aspect tightly closes the pod body with the cover, introduces a washing fluid into the pod through the inlet, and discharges the washing fluid from the pod through the outlet. This aspect needs no separate washing tank to clean the inside of the pod because it uses the pod itself as a washing tank.

A second aspect of the present invention provides a pod for storing substrates, having a pod body provided with an opening for taking in and out the substrates, a cover removably attached to the opening, and a fixing unit for fixing the pod body and cover together to tightly close the pod body. The pod body has an inlet for introducing fluid into the pod and an outlet for discharging the fluid from the pod.

The second aspect tightly closes the pod body with the cover, introduces a washing fluid into the pod through the inlet, and discharges the washing fluid from the pod through the outlet. This aspect needs no separate washing tank to clean the inside of the pod because it uses the pod itself as a washing tank.

A third aspect of the present invention provides a pod for storing substrates, having a pod body provided with an opening for taking in and out the substrates, a cover removably attached to the opening, and a fixing unit for fixing the pod body and cover together to tightly close the pod body. The cover is provided with a nozzle for jetting fluid into the pod and an outlet for discharging the fluid from the pod.

The third aspect tightly closes the pod body with the cover, jets a washing fluid into the pod through the nozzle, and discharges the washing fluid from the pod through the outlet. This aspect needs no separate washing tank to clean the inside of the pod because it uses the pod itself as a washing tank. The nozzle showers a washing fluid of high pressure into the pod, thereby improving the physical cleaning power of the washing fluid in the pod.

A fourth aspect of the present invention provides an apparatus for cleaning a pod for storing substrates. The apparatus has a cover and a discharge pump. The pod has an opening for taking in and out substrates. The cover is removably attached to the opening and has an outlet for discharging gas from the pod. The discharge pump is connected to the outlet of the cover.

The fourth aspect tightly attaches the cover to the pod and evacuates impurity gases from the pod through the outlet, thereby cleaning the inside of the pod.

A fifth aspect of the present invention provides an apparatus for cleaning a pod for storing substrates. The pod has an opening formed on one face thereof to take in and out substrates. The apparatus has a cover to be removably attached to the opening of the pod, an inlet formed on the cover to guide gas into the pod, an outlet formed on the cover to discharge gas from the pod, a gas supply source connected to the inlet of the cover, a gas adjuster arranged between the inlet of the cover and the gas supply source to adjust the flow rate of gas, a vacuum pump connected to the outlet of the cover, a pressure sensor for measuring a pressure in the pod, and a controller electrically connected to the gas adjuster, vacuum pump, and pressure sensor.

The fifth aspect sets a washed pod in the apparatus, evacuates remnants from the pod, and fills the pod with an inert gas.

A sixth aspect of the present invention provides an apparatus for processing substrates. The apparatus has a pod reception chamber, a pod processing chamber, a substrate processing chamber, and a transfer unit for transferring the pod and substrates between these chambers. The pod has an opening on one face thereof to take in and out substrates and a cover to be removably attached to the opening. The pod reception chamber has a unit for receiving a pod with substrates from the outside and a unit for taking the substrates out of the pod. The pod processing chamber has a unit for cleaning the inside of the pod. The substrate processing chamber has a unit for processing the substrates.

The sixth aspect cleans the inside of the pod in the pod processing chamber while processing the substrates in the substrate processing chamber.

The cover of the pod of the sixth aspect may have an inlet for guiding fluid into a pod and an outlet for discharging fluid from the pod. The unit for cleaning the inside of a pod may have a unit for fixing the opening of the pod and the cover together to tightly close the pod, a unit for introducing a washing liquid into the pod through the inlet of the cover, and a unit for discharging the washing liquid from the pod through the outlet of the cover. The cover may have a second outlet for discharging gas and a heater.

The unit for cleaning the inside of a pod may have a table for tightly closing the pod set on the table, an inlet formed on the table to introduce fluid into the pod, an outlet formed on the table to discharge fluid from the pod, a unit for introducing a washing liquid into the pod through the inlet, and a unit for discharging the washing liquid from the pod through the outlet. The table may have a second outlet for discharging gas and a heater.

BRIEF DESCRIPTION OF THE DRAWINGS

FIGS. 1A to 4B are sectional and perspective views showing pods according to an embodiment 1 of the present invention;

DETAILED DESCRIPTION OF THE EMBODIMENTS

Various embodiments of the present invention will be described with reference to the accompanying drawings.

[Embodiment 1]

FIGS. 1A to 4B show pods according to the embodiment 1 of the present invention. The pods of the embodiment 1 are characterized by a structure that is easy to wash and by a cover that is provided with an inlet and outlet for fluid.

(Embodiment 1-1)

Figure 1A:
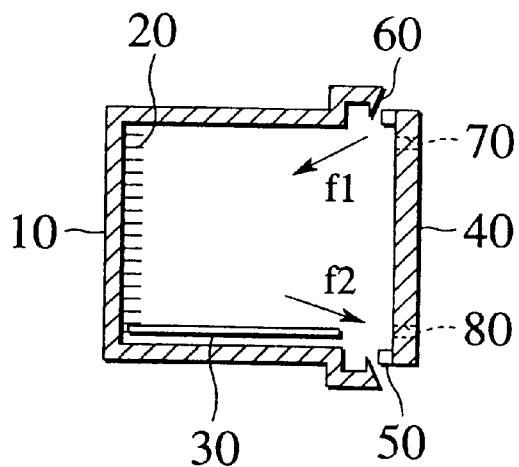
Figure 1B:
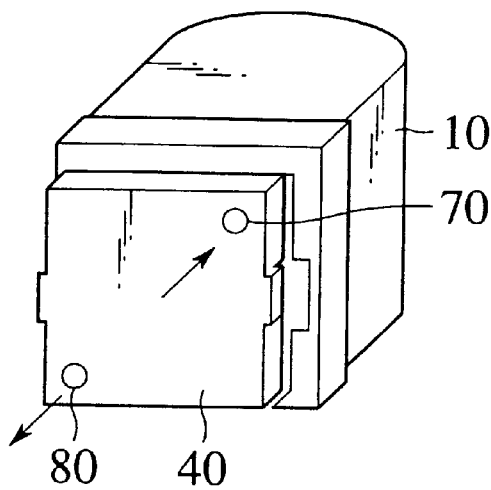

FIGS. 1A and 1B are sectional and perspective views showing a pod according to an embodiment 1-1 of the present invention. The pod consists of a pod body 10 and a cover 40. The pod body 10 has an opening formed on a side face thereof to take in and out wafers or substrates. The cover 40 is removably attached to the opening.

The inner wall of the pod body 10 has grooves at regular intervals to horizontally support wafers. Namely, the pod can directly store wafers without a wafer cassette. The grooves may be formed partially on the inner wall of the pod body 10, to support the wafers at two or three positions.

The plan shape of the pod body 10 may be curved in alignment with the shape of wafers stored therein.

Along the opening of the pod body 10, there is a fitting part 60 having a hooking end to hold the cover 40. The periphery of the cover 40 corresponding to the periphery of the opening of the pod body 10 is provided with a seal frame 50 so that the pod body 10 and cover 40 are tightly attached together. When the cover 40 is fitted to the pod body 10, the hooking end of the fitting part 60 warps toward the outside of the cover 40 and pushes the cover 40 inwardly from the outside, thereby tightly fixing the cover 40 to the pod body 10.

The pod of the embodiment 1-1 is characterized by an inlet 70 and an outlet 80 formed on the cover 40. The inlet and outlet are used to wash the inside of the pod.

The cover 40 is fitted to the pod body 10 to tightly close the inside of the pod body 10. The inlet 70 and outlet 80 are connected to pipes, and an acid or alkaline washing liquid is introduced into the pod through the pipe and inlet 70. At this time, the outlet 80 is closed to fill the pod with the washing liquid. Since the pod body 10 and cover 40 are tightly fitted together, the washing liquid never leaks outside.

The pod filled with the washing liquid is kept as it is for a set time to etch off contaminants adhering to the inner wall of the pod. Thereafter, the outlet 80 is opened to discharge the washing liquid from the pod. Rinsing pure water is supplied into the pod through the inlet 70. While the pure water is being poured into the pod, the liquid in the pod is gradually discharged from the outlet 80. Instead of the acid or alkaline washing liquid, a surfactant may be used. After rinsing the pod with the pure water, alcohol may be used to again wash the pod.

The locations of the inlet 70 and outlet 80 are not particularly limited. It is preferable that the inlet 70 is positioned close to the top of the pod and the outlet 80 close to the bottom of the pod to make the washing process easier.

The embodiment 1 is capable of washing pods without a separate washing tank or a bulky washing apparatus because it uses each pod itself as a washing tank. As a result, the embodiment 1 is inexpensive and saves the space of a clean room.

When washing a pod, wafers 30 may be left in the pod as shown in FIG. 1A so that not only the pod but also the wafers are cleaned.

The material of the pod is not particularly limited. It may be made of polycarbonate, metal, ceramics, resin, etc. A proper washing liquid must be selected so that it does not hurt the pod.

In FIG. 1A, the pod body 10 and cover 40 are fitted together with the fitting part 60 formed on the pod body 10. Any other fitting arrangement is employable to fix the pod body 10 and cover 40 together.

Figure 1C:
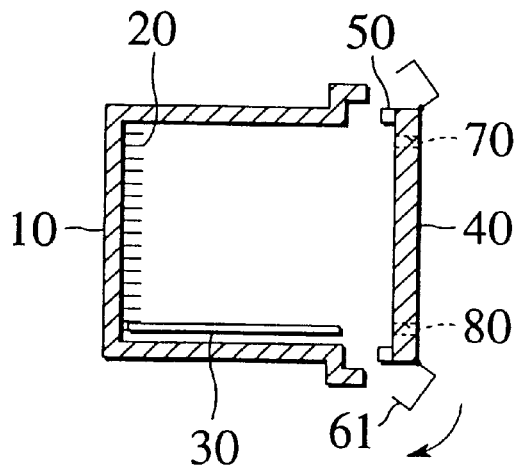
Figure 1D:
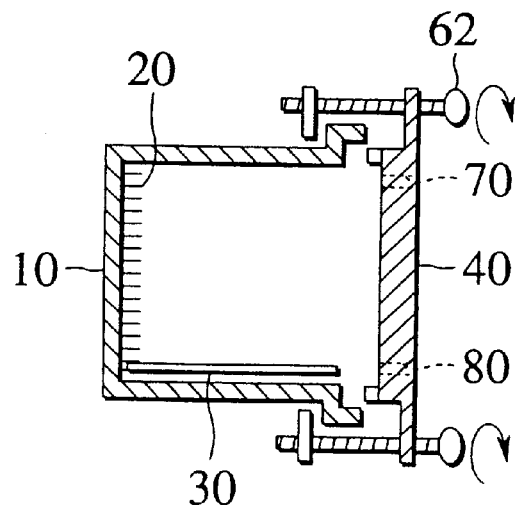

Examples of fitting arrangements are shown in FIGS. 1C to 2C. In FIG. 1C, a cover 40 has fixings 61 to tightly fit the cover 40 to a pod body 10. In FIG. 1D, bolts and nuts 62 fix a pod body 10 and cover 40 together.

In FIG. 2A, a cover 40 incorporates a rotatable cross hook 90. Grooves 110 are formed on the cover 40. A rotary tool 100 is inserted into the grooves 110 and is turned to turn the cross hook 90. Before fitting the cover 40 to a pod body 10, the cross hook 90 is retracted in the cover 40. After the cover 40 is attached to the pod body 10, the rotary tool 100 is inserted into the grooves 110 and is turned clockwise, so that the tips of the cross hook 90 may catch holes 120 formed at the periphery of the opening of the pod body 10. This tightly fixes the pod body 10 and cover 40 together.

The covers 40 of FIGS. 2A to 2C have each an inlet 70 and an outlet 80 to clean the insides of pods as explained above.

(Embodiment 1-2)

FIGS. 3A to 4B are sectional and perspective views showing pods according to an embodiment 1-2 of the present invention.

Figure 3A:
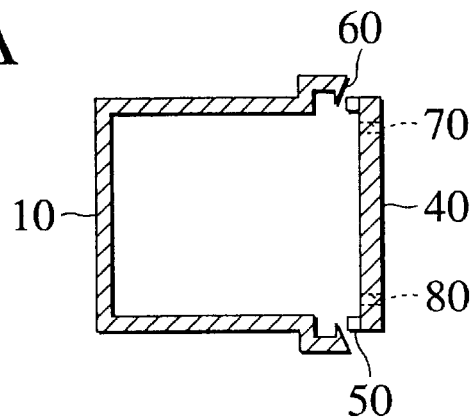

The pod of FIG. 3A has no grooves on the inner wall thereof to support wafers. Namely, wafers are stored in an open-type wafer cassette 130, which is stored in the pod. Except the wafer supporting grooves, the pod of FIG. 3A is the same as the pod of FIG. 1A. Namely, the pod of FIG. 3A is characterized by a cover 40 having an inlet 70 and an outlet 80.

After the cover 40 is fitted to a pod body 10, a washing liquid is introduced into the pod through the inlet 70 and is discharged from the pod through the outlet 80, thereby cleaning the inside of the pod.

Figure 3B:
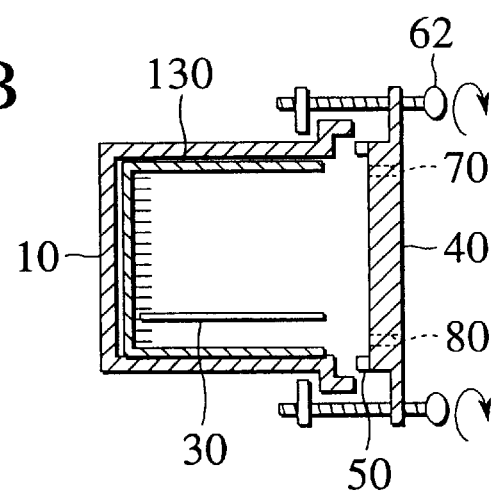

The pod of FIG. 3B has a pod body 10 and a cover 40 that are fixed together with bolts and nuts 62. The cover 40 has an inlet 70 and an outlet 80. A wafer cassette 130 with wafers is stored in the pod, the cover 40 is fitted to the pod body 10, the bolts 62 are fastened to close the pod, a washing liquid is introduced into the pod through the inlet 70, and the same is discharged from the pod through the outlet 80, thereby simultaneously cleaning the inside of the pod, the wafers, and the wafer cassette.

Figure 3C:
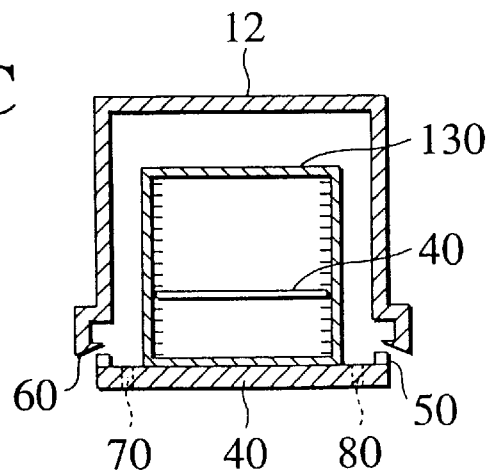

The pod of FIG. 3C has an opening at the bottom of a pod body 12. A cover 40 has an inlet 70 and an outlet 80. The cover 40 is fitted to the pod body 12 to close the pod, a washing liquid or rinsing liquid is introduced into the pod through the inlet 70, and the same is discharged from the pod through the outlet 80, thereby cleaning the inside of the pod. At this time, a wafer cassette 130 with wafers may be kept in the pod so that the wafers and cassette are cleaned together with the inside of the pods.

Figure 4A:
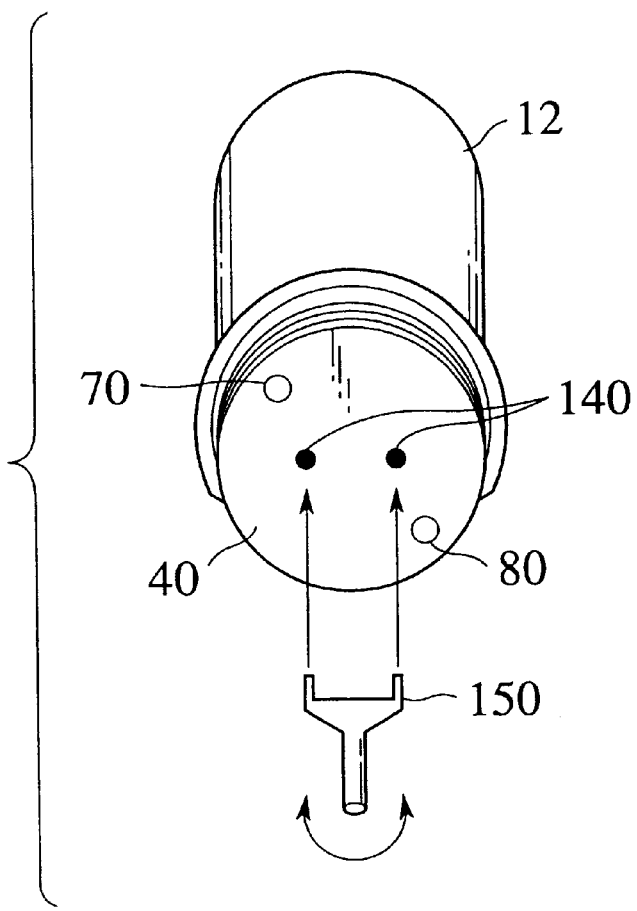
Figure 4B:
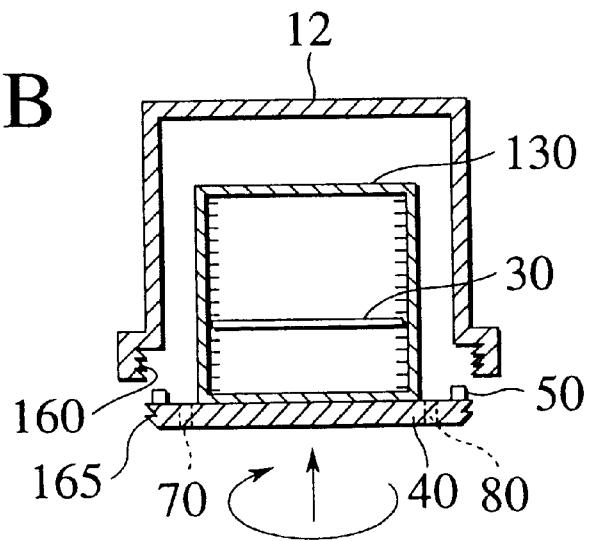

The pod of FIGS. 4A and 4B is cylindrical, and a cover 40 is attached to the bottom of a pod body 12 by threads 160 and 165 formed thereon.

In FIG. 4A, the cover 40 has an inlet 70, an outlet 80, and holes 140 for turning the cover 40. The threads of the pod body 12 and cover 40 are fastened together, a rotary tool 150 is inserted into the holes 140, and the same is turned clockwise to tightly fix the cover 40 to the pod body 12.

In this way, the pods of the embodiments 1-1 and 1-2 employ the covers 40 each having the inlet 70 and outlet 80 to easily wash and clean the insides of the pods.

The inlet 70 and outlet 80 are not limited to one each. There may be plural inlets and outlets formed on a pod cover. Fluid used to wash a pod through the inlet 70 and outlet 80 is not limited to liquid. It may be a washing gas. The fittings to fix a cover to a pod body are not limited to those explained above.

When storing and carrying substrates or wafers in the pods, the inlet and outlet of each cover 40 are closed with proper plugs to seal the insides of the pods.

[Embodiment 2]

FIGS. 5A to 5D show pods according to the embodiment 2 of the present invention. These pods are characterized by a pod body having an inlet and an outlet.

(Embodiment 2-1)

Figure 5A:
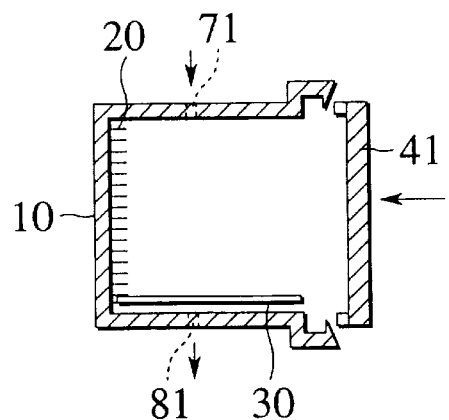
FIGS. 5A to 5E are sectional views showing pods according to an embodiment 2 of the present invention.

The pod of FIG. 5A consists of a pod body 10 and a cover 41. The pod body 10 has an opening formed on a side face thereof to take in and out wafers. The cover 41 is attached to the opening of the pod body 10. The pod body 10 has an inlet 71 and an outlet 81.

Figure 5B:
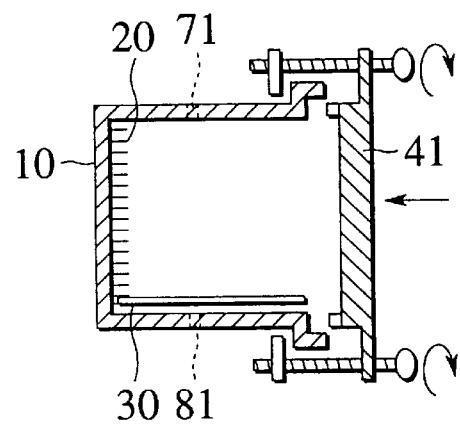

The pod body 10 and cover 41 are fixed together to tightly close the pod. In FIG. 5A, the cover 41 is fitted to the pod body 10. In FIG. 5B, the pod body 10 and cover 41 are fixed together with bolts and nuts.

After the pod body 10 and cover 41 are fixed together, the outlet 81 is closed, a washing liquid such as an acid or alkaline liquid is introduced into the pod through the inlet 71, the liquid is kept for a predetermined time to etch off contaminants on the inner wall of the pod, the washing liquid is discharged from the pod through the outlet 81, pure water is supplied into the pod through the inlet 71, and the same is discharged from the pod through the outlet 81, thereby rinsing and cleaning the inside of the pod.

This embodiment needs no separate washing tank to clean the inside of the pod because it uses the pod itself as a washing tank. As a result, this embodiment is economical and saves the space of a clean room. The pods of this embodiment may periodically be cleaned to properly maintain a clean atmosphere for wafers in the pods.

The pods of this embodiment may be cleaned with wafers being stored therein. In this case, not only the pods themselves but also the wafers are cleaned.

Figure 5C:
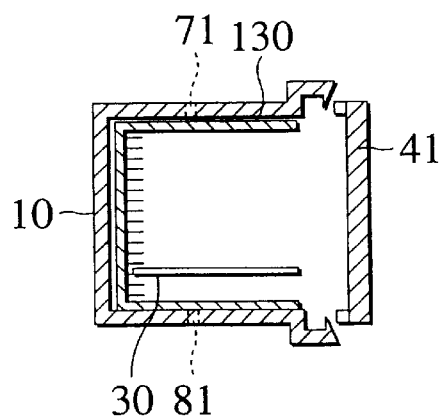
Figure 5D:
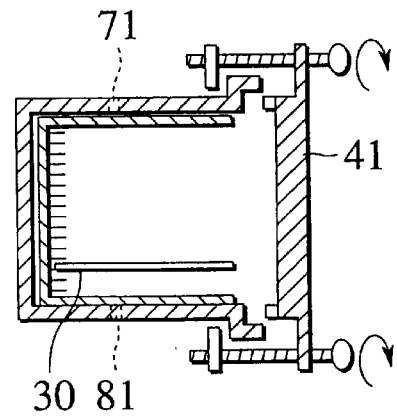

In FIGS. 5A and 5B, the pods have grooves 20 for directly supporting wafers. In FIGS. 5C and 5D, the pods have no such grooves, to store a wafer cassette that contains wafers.

(Embodiment 2-2)

Figure 5E:
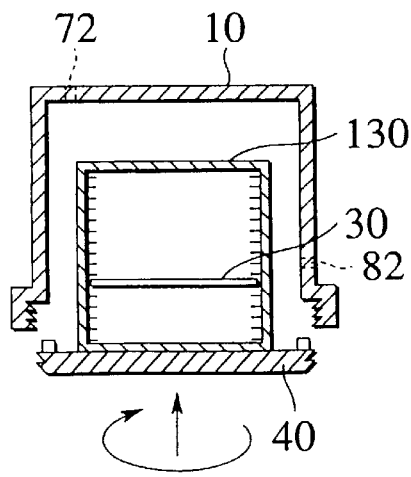

FIG. 5E shows a pod according to an embodiment 2-2 of the present invention. The pod is cylindrical and has an opening at the bottom thereof to take in and out wafers. The pod consists of a pod body 10 and a cover 41. The pod body 10 has an inlet 72 and an outlet 82 to easily wash the inside of the pod.

It is preferable that the inlet 71 (72) is formed as high as possible on the pod body 10, and the outlet 81 (82) as low as possible. The pods of FIGS. 5A to 5D with an opening being formed on a side face thereof have each the inlet 71 on the top of the pod body 10 and the outlet 81 on the bottom of the pod body 10.

The pod of FIG. 5E having the bottom opening has the inlet 72 on the top of the pod body 10 and the outlet 82 on the side wall of the pod body 10 adjacent to a fitting for fixing the cover 41 to the pod body 10.

The fittings of the embodiment 1 or any other fittings for fixing a cover to a pod body are applicable to the embodiment 2.

[Embodiment 3]

Figure 6A:
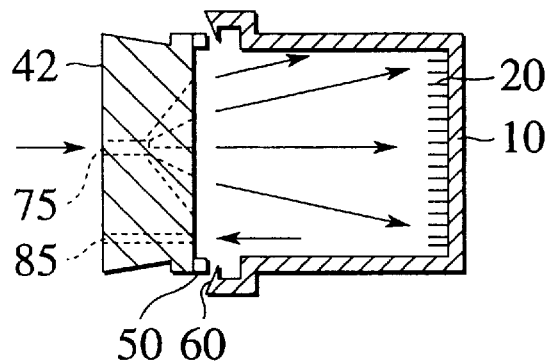
FIGS. 6A to 6C are sectional views showing pods according to an embodiment 3 of the present invention.
Figure 6B:
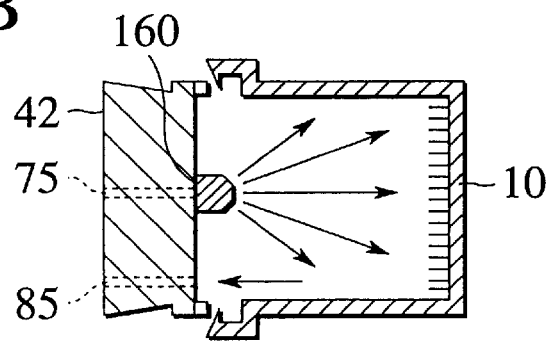
Figure 6C:
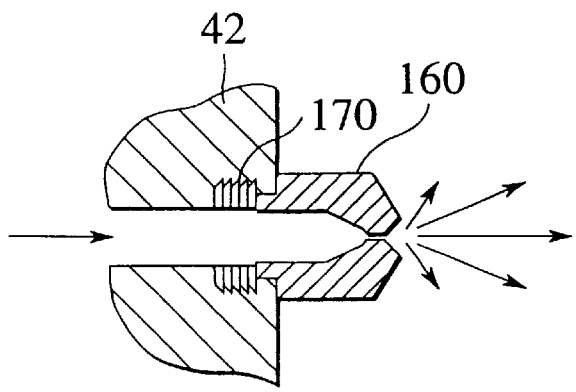

FIGS. 6A to 6C show pods according to the embodiment 3 of the present invention. The embodiment 3 is characterized in that each cover has an inlet and an outlet and the inlet has a structure for jetting fluid.

(Embodiment 3-1)

FIG. 6A shows a pod according to an embodiment 3-1. The pod consists of a pod body 10 and a cover 42 that is tightly fitted to the pod body 10 to close the pod. The fittings of the embodiments 1 and 2 or any other fittings for fixing a cover to a pod body are applicable to the embodiment 3.

The cover 42 has an injection inlet 75 and an outlet 85. The injection inlet 75 has thin holes arranged parabolically to jet liquid into the pod.

The cover 42 is removably fitted to the pod body 10 to tightly close the pod. A washing liquid is supplied into the pod through the injection inlet 75 and is discharged from the pod through the outlet 85, thereby washing the inside of the pod without a special washing apparatus. The washing liquid of high pressure is showered into the pod through the injection inlet 75, to strongly wash the inside of the pod.

(Embodiment 3-2)

FIG. 6B shows a pod according to an embodiment 3-2 of the present invention. The pod consists of a pod body 10 and a cover 42. The cover 42 has an inlet 75 and an outlet 85. The inlet 75 is provided with a nozzle 160.

FIG. 6C is an enlarged view showing the nozzle 160 and the periphery thereof. The tip of the nozzle 160 is thinned to jet liquid of high pressure into the pod, thereby enhancing a washing effect.

The nozzle 160 may be fixed to the cover 42 in various ways. In FIG. 6C, the nozzle 160 is screwed into the cover 42 so that it may easily be replaced.

It is possible to use a conventional cover for the pod body 10 when storing and carrying the pod, and only when washing the pod, attach one of the covers 42 of the embodiments 3-1 and 3-2 to the pod body 10.

Wafers can be left in the pods when the pods are washed so that not only the inner walls of the pods but also the wafers are washed.

In FIGS. 6A and 6B, the pod bodies 10 have grooves for directly supporting wafers. These grooves are not always necessary for the pod bodies. The pod bodies and covers of the embodiment 3 are fixed together in various ways like the embodiments 1 and 2.

[Embodiment 4]

Figure 7A:
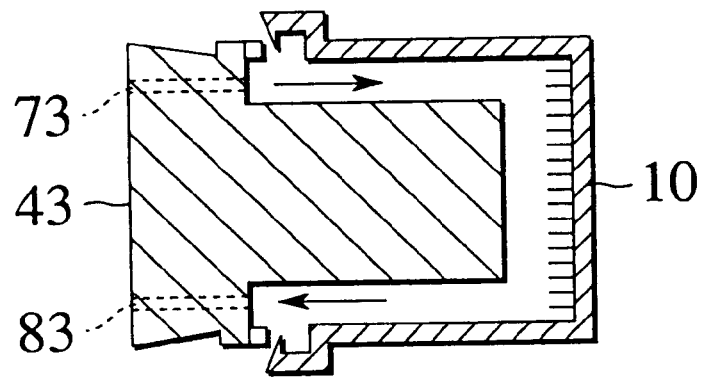
FIGS. 7A and 7B are sectional views showing pods according to an embodiment 4 of the present invention.
Figure 7B:
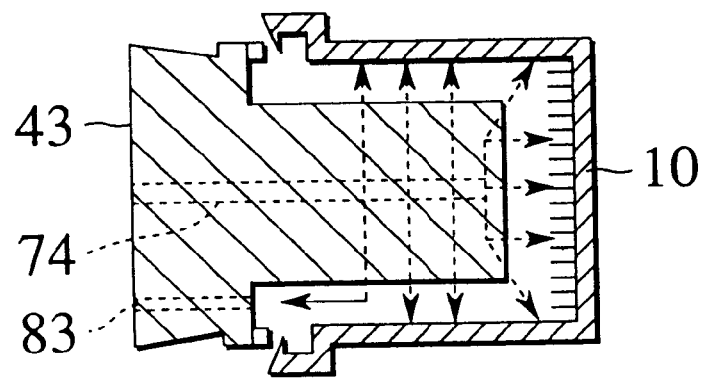

FIGS. 7A and 7B show pods according to the embodiment 4 of the present invention. This embodiment is characterized by a cover having a projection.

(Embodiment 4-1)

FIG. 7A is a sectional view showing a pod according to an embodiment 4-1. The pod consists of a pod body 10 and a cover 43.

The cover 43 has a projection protruding into the pod body 10. The size of the projection is not particularly limited. For example, the diameter of the projection is ½ to ⅔ of the inner diameter of the pod body 10. The cover 43 has an inlet 73 and an outlet 83.

The cover 43 is tightly fitted to the pod body 10. A washing liquid is introduced into the pod through the inlet 73 and is discharged from the pod through the outlet 83, thereby washing the inside of the pod by using the pod itself as a washing tank. At this time, the projection of the cover 43 reduces the inner volume of the pod, so that a small quantity of washing liquid can fill the inside of the pod. Namely, a small quantity of washing liquid will sufficiently wash the inside of the pod in a short time.

The pod body 10 has an opening for taking in and out wafers. The pod body 10 may have grooves for directly supporting wafers as shown in FIG. 7A.

(Embodiment 4-2)

FIG. 7B is a sectional view showing a pod according to an embodiment 4-2. The pod consists of a pod body 10 and a cover 43.

The cover 43 has a projection protruding into the pod body 10. An inlet 74 of the cover 43 is branched into thin holes in the cover 43. The thin holes are equally distributed on the surface of the projection to jet liquid equally onto the inner wall of the pod, thereby realizing a high washing effect over the inner wall of the pod.

It is possible to use conventional covers for the pods of the embodiment 4 when storing and transferring the pods, and only when washing the pods, use the covers 42 of the embodiment 4.

[Embodiment 5]

Figure 8A:
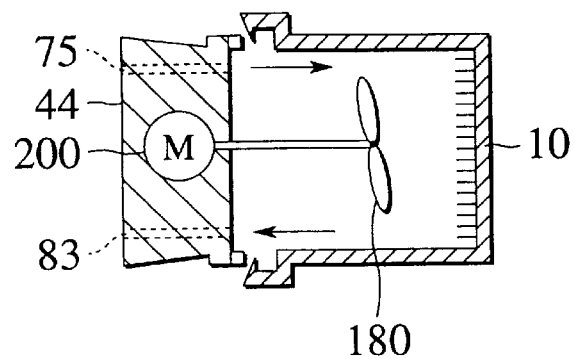
FIGS. 8A to 8C are sectional views showing pods according to an embodiment 5 of the present invention.
Figure 8B:
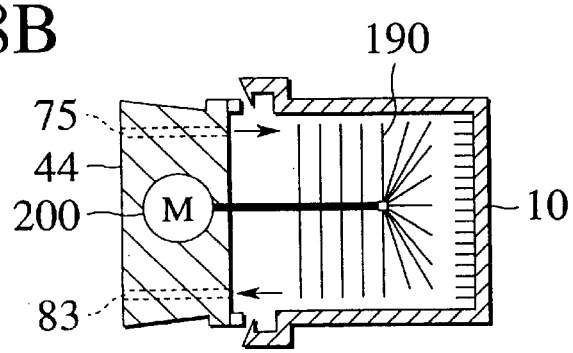
Figure 8C:
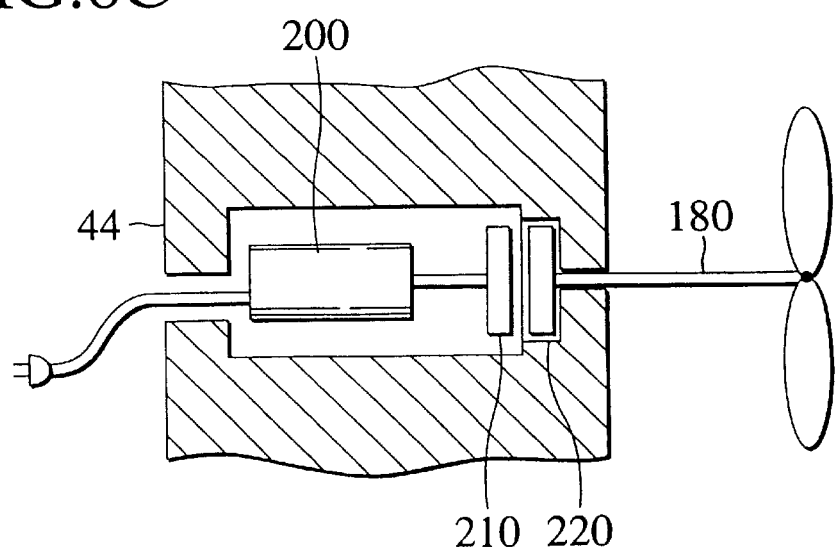

FIGS. 8A to 8C show pods according to the embodiment 5. This embodiment is characterized by an agitating fin.

(Embodiment 5-1)

FIG. 8A is a sectional view showing a pod according to an embodiment 5-1. The pod consists of a pod body 10 and a cover 44.

The cover 44 has an inlet 75 and an outlet 85. In addition, the cover 44 has an agitating fin 180 and a motor 200 for driving the fin 180. The cover 44 is tightly attached to the pod body 10, a washing liquid is introduced into the pod through the inlet 75 to fill the pod with the washing liquid, and the motor 200 is started to rotate the fin 180. The fin 180 agitates the washing liquid and generates swirls in the pod, thereby improving the washing power of the washing liquid.

FIG. 8C is a partial section showing the details of the motor 200 and fin 180 of the cover 44. The motor 200 has a magnet at a rotary end 210 thereof, and the fin 180 also has a magnet at a base 220 thereof. When the rotary end 210 turns, the fin 180 also turns due to magnetic repulsion.

(Embodiment 5-2)

FIG. 8B is a sectional view showing a pod according to an embodiment 5-2 of the present invention. The pod consists of a pod body 10 and a cover 44.

The cover 44 has an inlet 75, an outlet 85, a rotary brush 190, and a motor 200 for driving the brush 190.

The cover 44 is tightly attached to the pod body 10 to close the pod, a washing liquid is supplied into the pod through the inlet 75 to fill the pod with the washing liquid, and the motor 200 is started to rotate the brush 190. The brush 190 generates swirls in the washing liquid and applies physical washing force on the inner wall of the pod.

The pod bodies 10 of the embodiment 5 have grooves on the inner walls thereof to directly support wafers. Any other pod bodies such as those of the embodiments 1 and 2 are applicable to the embodiment 5.

[Embodiment 6]

FIGS. 9A to 10B show pods according to the embodiment 6 of the present invention. This embodiment is characterized by a cover having an outlet.

Unlike the embodiments 1 to 5 that wash the inside of a pod, the embodiment 6 cleans and dries the inside of a pod.

(Embodiment 6-1)

Figure 9A:
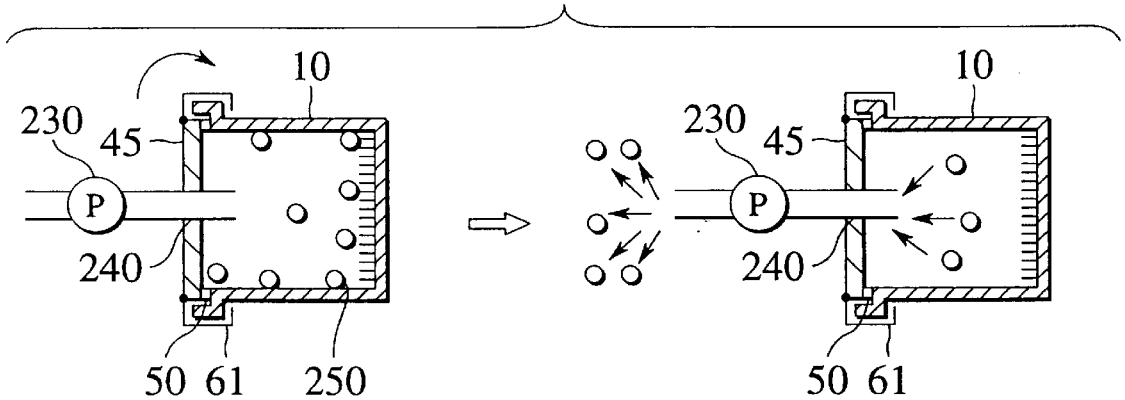
FIGS. 9A to 10B are sectional views showing covers for cleaning and drying pods, according to an embodiment 6 of the present invention.

FIG. 9A is a sectional view showing a pod according to an embodiment 6-1 of the present invention. The pod consists of a pod body 10 and a cover 45. The left part of FIG. 9A shows the cover 45 being attached to the pod body 10, and the right part thereof shows a vacuum pump 230 being operated.

The pod body 10 has an opening on a side face thereof to take in and out wafers. The cover 45 is attached to the opening. The cover 45 has an outlet 240, which is connected to the vacuum pump 230.

The cover 45 can be fitted to the pod body 10 according to any fitting technique. In FIG. 9A, the cover 45 has a fixing frame 61 to fix the cover 45 to the pod body 10.

Conventional pods used for semiconductor processing are rarely washed, and therefore, the inner walls thereof accumulate contaminants 250 after a long time of use as shown in the left part of FIG. 9A. The contaminants are water, oxygen, etc., to contaminate wafers stored in the pods.

After a certain period of use of the pod, the cover 45 having the outlet 240 is attached to the pod body 10 to close the same, and the outlet 240 is connected to the vacuum pump 230 through a pipe. The pump 230 evacuates the pod so that the contaminants are discharged from the pod as shown in the right part of FIG. 9A.

Although the pod of FIG. 9A stores no wafers, wafers may be left in the pod when the cover 45 is attached to the pod body 10 to evacuate the pod.

A conventional cover having no outlet 240 can be attached to the pod body 10 when storing and transferring the pod, and only when the pod is cleaned, the conventional cover is replaced with the cover 45 having the outlet 240.

(Embodiment 6-2)

Figure 9B:
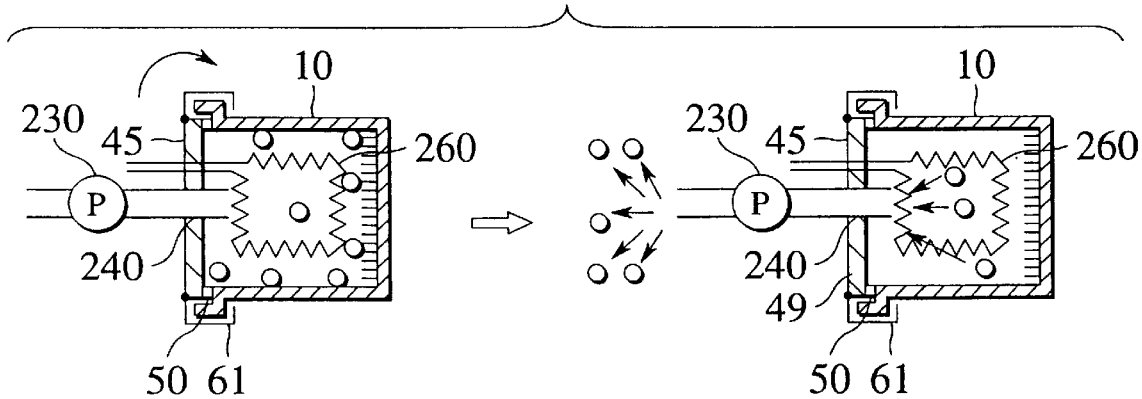

FIG. 9B is a sectional view showing a pod according to an embodiment 6-2. The pod consists of a pod body 10 and a cover 45.

The cover 45 has an outlet 240 to be connected to a vacuum pump 230, as well as a heater 260 for heating the inside of the pod.

In the left part of FIG. 9B, the cover 45 is tightly fitted to the pod body 10, and the heater 260 is turned on to heat the inside of the pod. Then, the vacuum pump 230 is started to easily volatilize contaminants adhering to the inner wall of the pod. In particular, water in the pod is easily volatilized by the heater 260 and is discharged from the pod. This embodiment effectively cleans the inside of the pod.

The temperature attained by the heater 260 is higher the better. The temperature, however, must be determined according to the heat resistance of the material of the pod. The pod may be made of metal. For example, the pod body 10 and cover 45 may be made of stainless steel and the seal thereof of copper. In this case, the temperature may be increased to several hundreds of degrees.

(Embodiment 6-3)

Figure 10A:
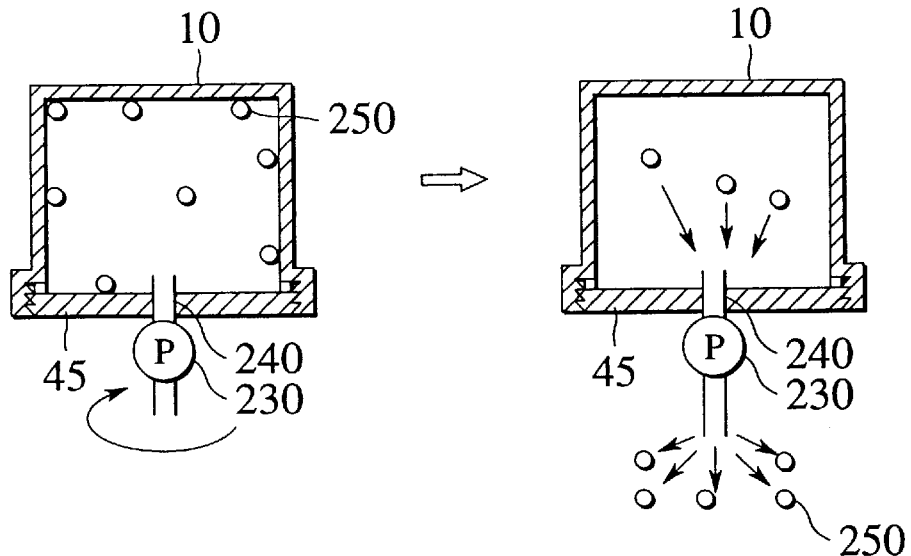
Figure 10B:
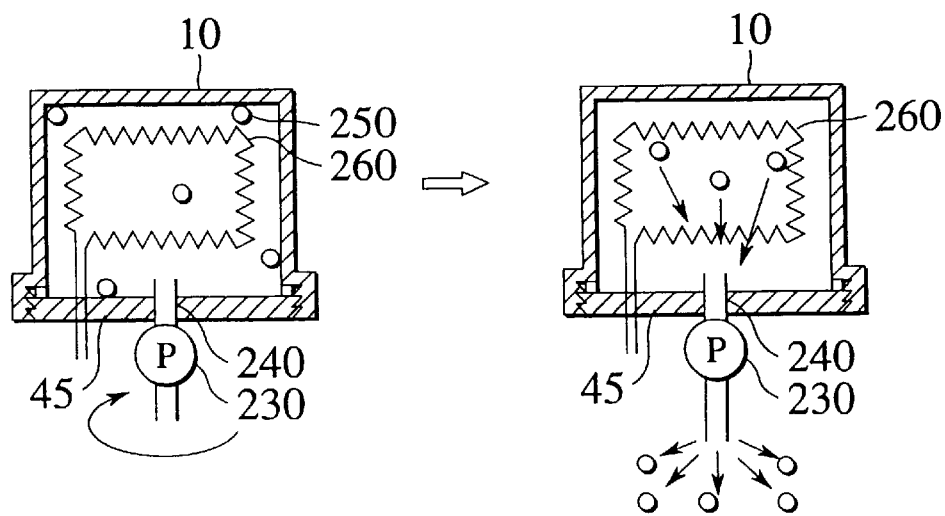

FIGS. 10A and 10B are sectional views showing pods each consisting of a pod body 10 and a cover 45. The left part of each figure shows the cover 45 being fitted to the pod body 10, and the right part thereof shows a vacuum pump 230 being operated.

Each pod has an opening at the bottom thereof, and the cover 45 is screwed into the pod body 10.

Irrespective of whether the opening of the pod body 10 is on the bottom or side face thereof, the cover 45 having an outlet 240 is fitted to the pod body 10, and the vacuum pump 230 is connected to the outlet 240. The vacuum pump 230 is driven to evacuate the pod, to thereby discharge contaminants adhering to the inner wall of the pod to the outside of the pod.

In FIG. 10B, the cover 45 has a heater 260 in addition to the outlet 240. The heater 260 heats the inside of the pod to volatilize contaminants in the pod, to more effectively discharge the contaminants out of the pod.

[Embodiment 7]

The embodiment 7 of the present invention will be explained with reference to FIG. 11A.

The embodiment 7 relates to a post-process to be carried out after a pod is washed according to any one of the embodiments 1 to 5 or any other techniques. The post-process is carried out with the use of the cover 45 of the embodiment 6.

Figure 11A:
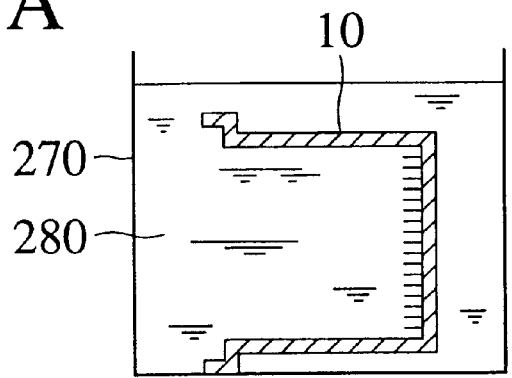
FIGS. 11A to 11C are sectional views showing covers for cleaning and drying pods, according to an embodiment 7 of the present invention.

In FIG. 11A, a pod is washed according to a conventional washing process. A washing tank 270 is filled with a washing liquid 280. A pod body 10 of the pod is dipped in the washing liquid 280 so that contaminants on the inner wall of the pod body 10 are etched off. Thereafter, the pod body 10 is washed with pure water. After that, remnants on the inner wall of the pod body 10 must be removed and the pod body 10 must be dried.

Figure 11B:
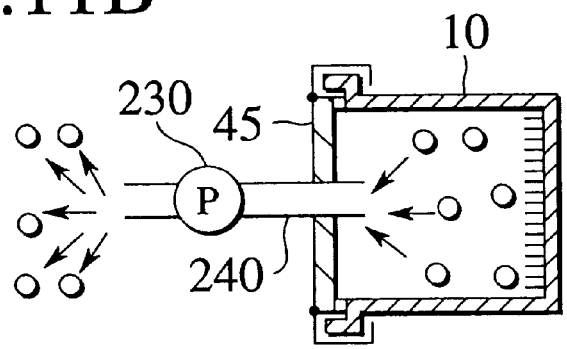

In FIG. 11B, the cover 45 having the outlet 240 connected to the vacuum pump 230 is tightly fitted to the pod body 10, to evacuate the pod body 10. This technique needs no large dryer, to effectively remove remnants from the pod body 10.

Figure 11C:
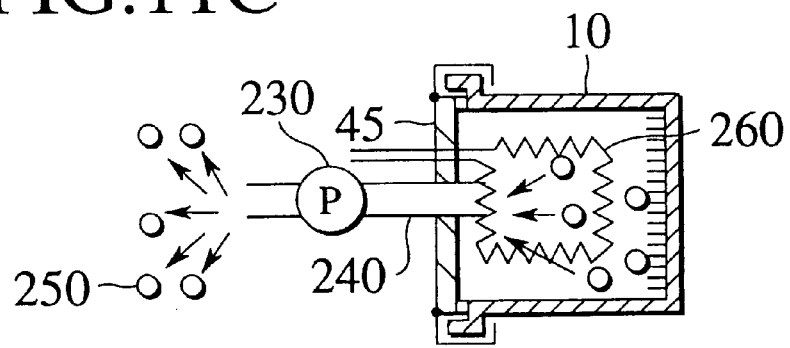

In FIG. 11C, the cover 45 having the heater 260 is used to dry the pod body 10. The heater 260 quickly dries the inside of the pod body 10 and removes remnants 250 from the pod body 10.

The inside of a pod can be washed not only by dipping the pod in a tank filled with a washing liquid but also by any one of the embodiments 1 to 5 that employ the covers having an inlet and an outlet. If any one of the embodiments 1 to 5 is employed, a series of washing processes can be completed only by changing the cover of a given pod.

Fixing a cover to a pod body can be achieved according to any technique as mentioned above.

[Embodiment 8]

The embodiment 8 of the present invention will be explained with reference to FIGS. 12A to 14B. This embodiment employs a cleaning apparatus to carry out a post-process on a washed pod.

(Embodiment 8-1)

Figure 12A:
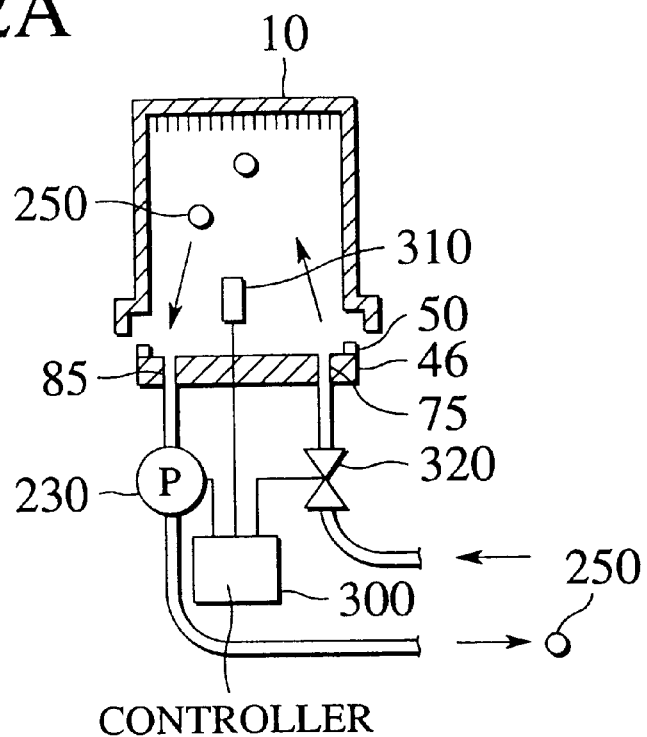
FIGS. 12A to 14B are sectional views showing pod washing apparatuses according to an embodiment 8 of the present invention.

FIG. 12A is a sectional view showing a cleaning apparatus employing a pod body 10 and a cover 46 according to an embodiment 8-1 of the present invention.

The cover 46 has an inlet 75 and an outlet 85. The inlet 75 is connected to a pipe, which is connected to a gas supply source (not shown). In the middle of the pipe, a valve 320 for adjusting a gas supply rate is arranged.

The outlet 85 is connected to a pipe in which a vacuum pump 230 is arranged to evacuate the pod.

The cover 46 is provided with a pressure sensor 310 to monitor a pressure in the pod. The pressure sensor 310, valve 320, and pump 230 are electrically connected to a controller 300, which controls a gas supply rate and gas discharge rate according to the pressure in the pod.

The post-process to be carried out on a washed pod will be explained. The pod is washed according to a conventional technique or any one of the embodiments 1 to 5. The cover 46 is tightly attached to the pod body 10. The valve 320 is closed, and the pump 230 is started to evacuate the pod and remove remnants from the pod. When the pressure sensor 310 indicates a pressure level below a set level, for example, 100 Pa, the pump 230 is stopped, or a valve (not shown) is used to stop the discharging of the pod.

The valve 320 is opened to gradually introduce a high purity inert gas of, for example, nitrogen ($N_2$) or argon (Ar). When the pressure sensor 310 indicates an atmospheric pressure, the valve 320 is closed, or the cover 46 is removed from the pod body 10, to complete the post-process. At this time, remnant gases in the pod have been replaced with the high purity inert gas.

Although the arrangement of FIG. 12A shows no tool for fixing the cover 46 to the pod body 10, they will naturally be joined together when the pod is evacuated, or any fitting of the preceding embodiments will be employed.

Figure 12B:
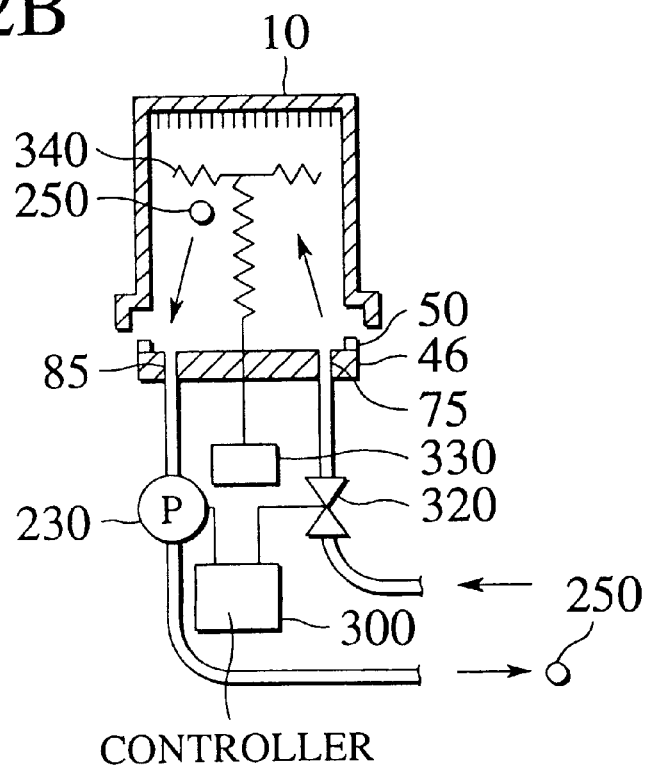

The embodiment of FIG. 12B provides the cover 46 of FIG. 12A with a heater 340. The cover 46 is attached to the pod 10, and the heater 340 is turned on before evacuating the pod with the pump 230 or during the evacuation of the pod. Heating the inside of the washed pod easily gasifies remnants in the pod. Thereafter, the pod is filled with an inert gas as mentioned above, to thereby effectively remove the remnants from the pod.

Figure 13:
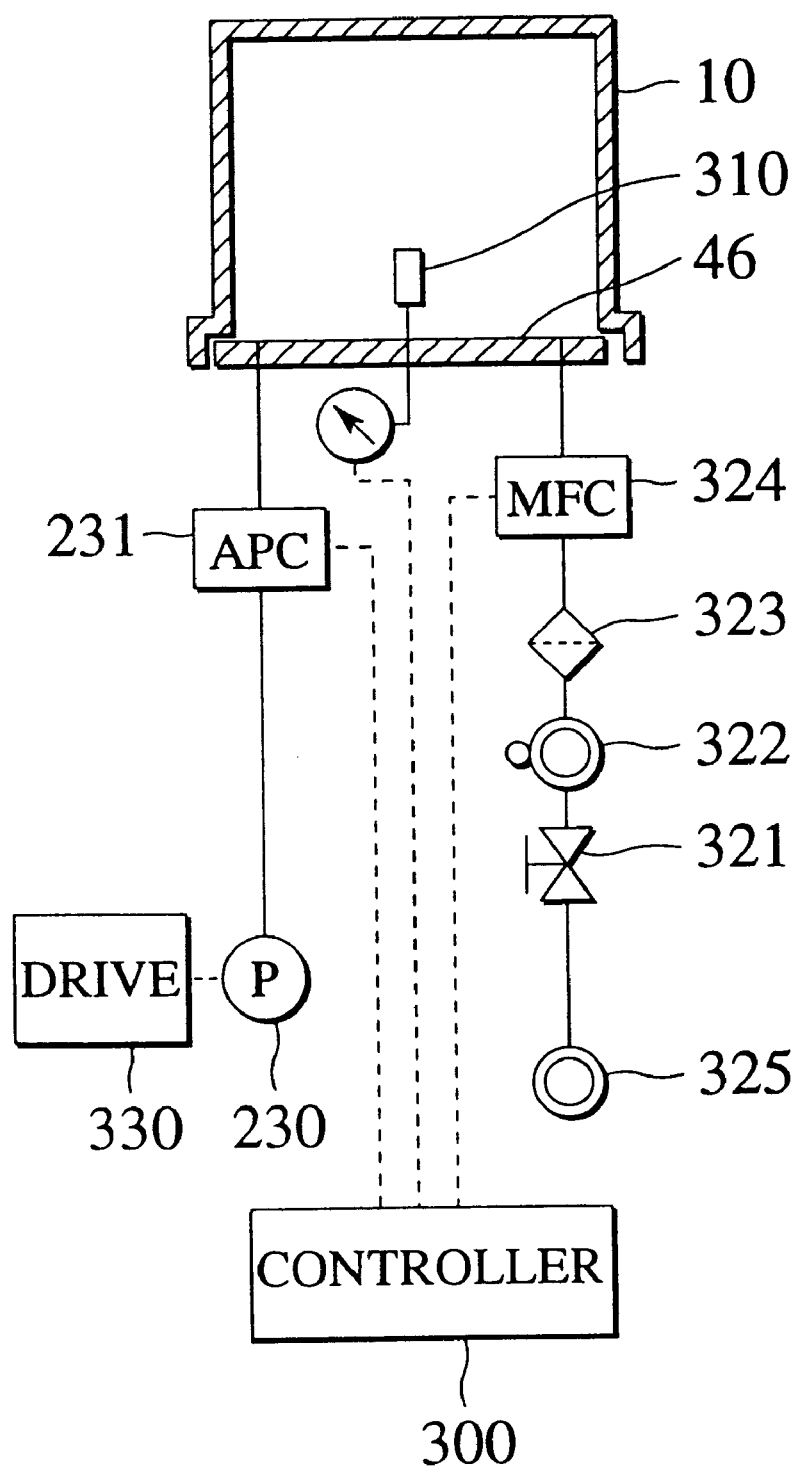

FIG. 13 shows the details of the cover 46 of FIG. 12A and piping connected thereto. An automatic pressure controller (APC) 231 may be connected to the pipe that is connected to the outlet of the cover 46. The APC 231 is in front of the pump 230. The APC 231 is electrically connected to the controller 300, to automatically adjust a discharge rate in response to the output of the pressure sensor 310.

A valve 321, a pressure gauge 322, a filter 323, a mass flow controller (MFC) 324, etc., may be connected to the pipe that extends between the inlet of the cover 46 and the inert gas supply source 325. The MFC 324 is electrically connected to the controller 300, to automatically adjust a gas supply rate in response to the output of the pressure sensor 310.

Figure 14A:
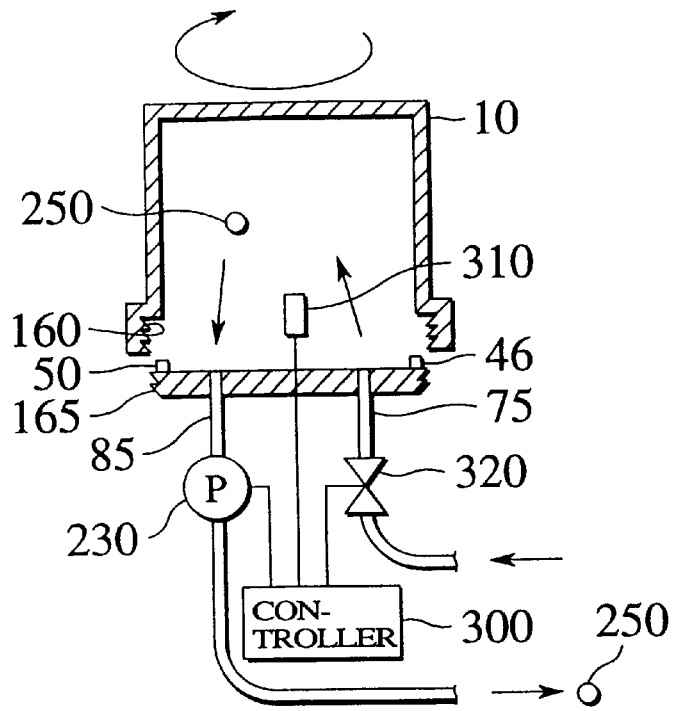
Figure 14B:
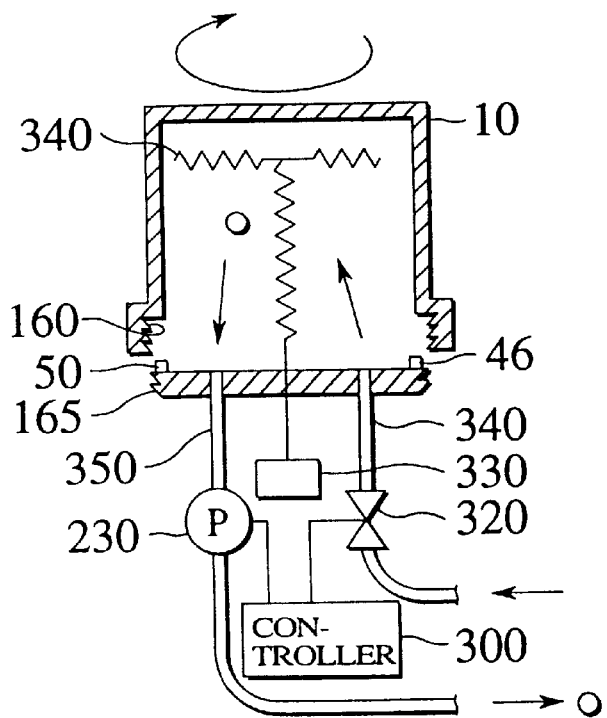

In FIGS. 11A to 12B, each pod body 10 has grooves on the inner wall thereof, to directly support wafers, and jointing between the pod body 10 and the cover 46 is by fitting them together. These structures do not limit the present invention. For example, pod bodies having no grooves for supporting wafers may be used as shown in FIGS. 14A and 14B. Jointing between the pod bodies 10 and the covers 46 may be of a screw type as shown in FIGS. 14A and 14B, or of any other type.

[Embodiment 9]

The embodiment 9 of the present invention will be explained with reference to FIGS. 15 to 24. This embodiment relates to semiconductor processing apparatuses having a pod cleaning function.

(Embodiment 9-1)

Figure 15A:
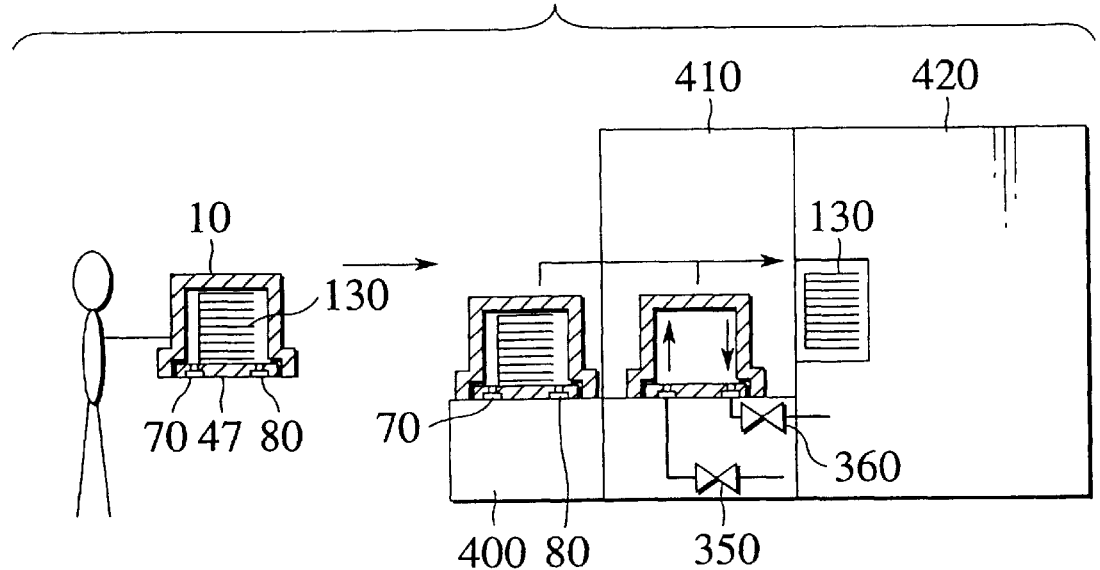
FIGS. 15A to 24B are sectional views showing semiconductor processing apparatuses according to an embodiment 9 of the present invention.

FIG. 15A shows a semiconductor processing apparatus according to an embodiment 9-1 of the present invention and a series of processes carried out thereby. The apparatus has a pod reception chamber 400, a pod processing chamber 410, and a wafer processing chamber 420. The wafer processing chamber 420 involves wafer processing units for forming or etching thin films on wafers.

The apparatus handles, as an example, a cylindrical pod having an opening at the bottom thereof to take in and out wafers. Wafers are stored in a conventional open-type wafer cassette 130, which is stored in the pod. The pod consists of a pod body 10 and a cover 47. The cover 47 may be of the embodiment 1 having an inlet 70 and an outlet 80.

Generally, wafers are transferred in pods between semiconductor processing apparatuses. The pod reception chamber 400 of the semiconductor processing apparatus receives a given pod. Although the pod of FIG. 15A is carried by a person, it may be carried by machine such as a transportation robot.

In FIG. 15A, the pod with wafers is set in the pod reception chamber 400. The wafers set in the wafer cassette 130 are taken out of the pod and transferred to the wafer processing chamber 420. The vacant pod is left in the pod processing chamber 410.

Figure 16A:
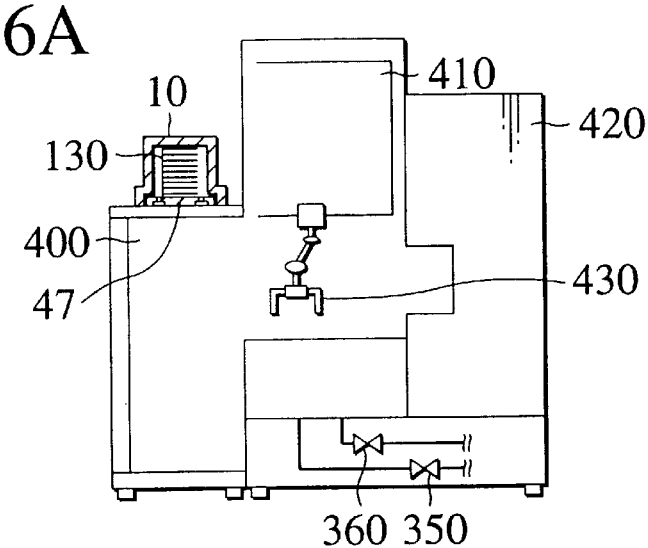
Figure 16B:
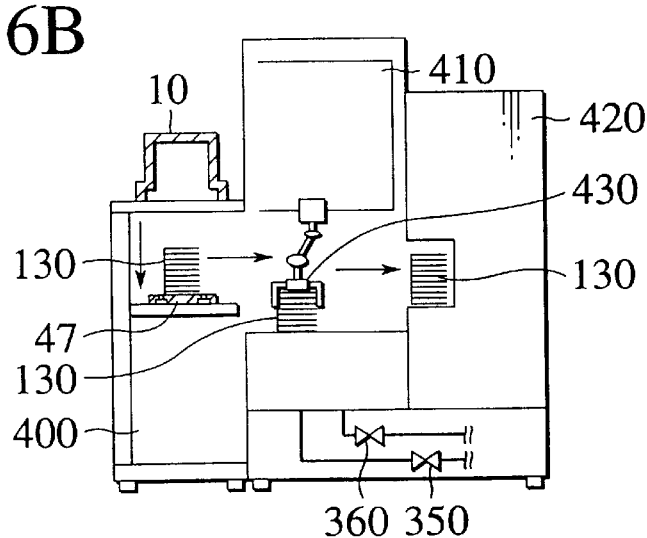
Figure 16C:
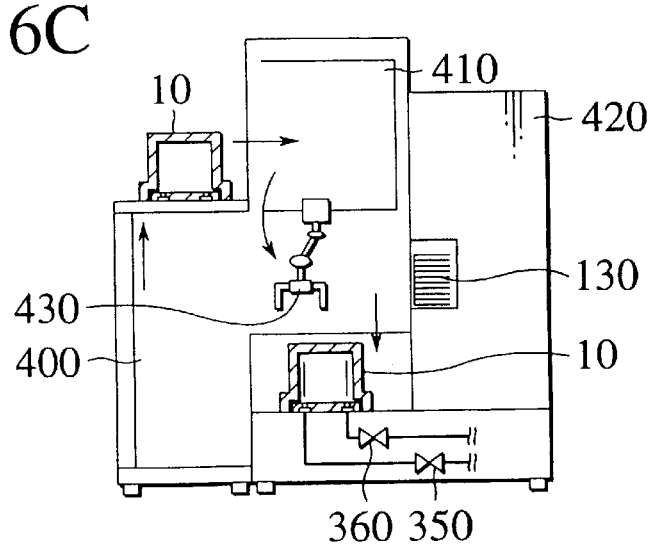

FIGS. 16A to 16C show the wafer transferring process. In FIG. 16A, the pod is in the pod reception chamber 400. In FIG. 16B, the cover 47 is removed from the bottom of the pod. The pod body 10 is left there. The cover 47 and the wafer cassette 130 thereon are put on a vertically movable table, which carries them downwardly. The pod processing chamber 410 has an arm 430. The arm 430 carries the wafer cassette 130 with the wafers therein from the pod reception chamber 400 to the wafer processing chamber 420 through the pod processing chamber 410. The wafers in the chamber 420 are processed in various ways.

In FIG. 16C, the cover 47 is returned to a predetermined position in the pod reception chamber 400 where the pod body 10 is left and is attached to the opening of the pod body 10. The pod body 10 with the cover 47 is moved to the pod processing chamber 410 and is set at a predetermined position by the arm 430.

The inlet and outlet of the cover 47 are connected to pipes arranged in the pod processing chamber 410. The pipes have valves 350 and 360. The valve 360 is opened to introduce a washing liquid into the pod and is closed to fill the pod with the washing liquid, thereby washing the inside of the pod.

In this way, the semiconductor processing apparatus of this embodiment has the pod processing chamber 410 separately from the wafer processing chamber 420, to clean a pod while processing wafers in the chamber 420. The pod processing chamber 410 is provided with the pipes to be connected to the inlet 70 and outlet 80 of the cover 47, so that the pod itself serves as a washing tank to wash the inside thereof. This helps reduce the size of the pod processing chamber 410. Since the pod processing chamber 410 is adjacent to the wafer processing chamber 420, there is no need of transferring the pod to a cleaning apparatus at a distant location, thereby improving the efficiency of the pod cleaning process.

(Embodiment 9-2)

Figure 15B:
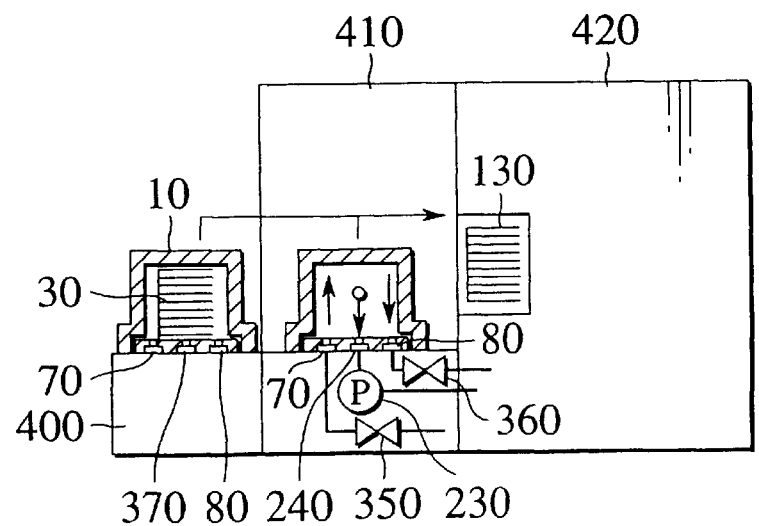

FIG. 15B shows a semiconductor processing apparatus according to an embodiment 9-2 of the present invention and a series of processes carried out thereby. The apparatus has a pod reception chamber 400, a pod processing chamber 410, and a wafer processing chamber 420. A pod handled by the apparatus consists of a pod body 10 and a cover 47. The pod body 10 has a bottom opening, and the cover 47 has an inlet 70, a first outlet 80, and a second outlet 370.

Wafers are held in a wafer cassette 130, which is stored in the pod. After the cassette 130 with the wafers is transferred from the pod to the wafer processing chamber 420, the pod body 10 and cover 47 are moved to a predetermined position in the pod processing chamber 410. The inlet 70 and outlet 80 of the cover 47 are connected to pipes having valves 350 and 360. The outlet 370 is connected to a pipe that is connected to a vacuum pump 230.

The pod is filled with a washing liquid to clean the inside thereof. Thereafter, the pod is evacuated by the pump 230 through the outlet 370, to remove remnants from the pod.

Mechanisms for transferring the pod and wafers of the apparatus of FIG. 15B are the same as those of FIG. 16A to 16C.

(Embodiment 9-3)

Figure 17A:
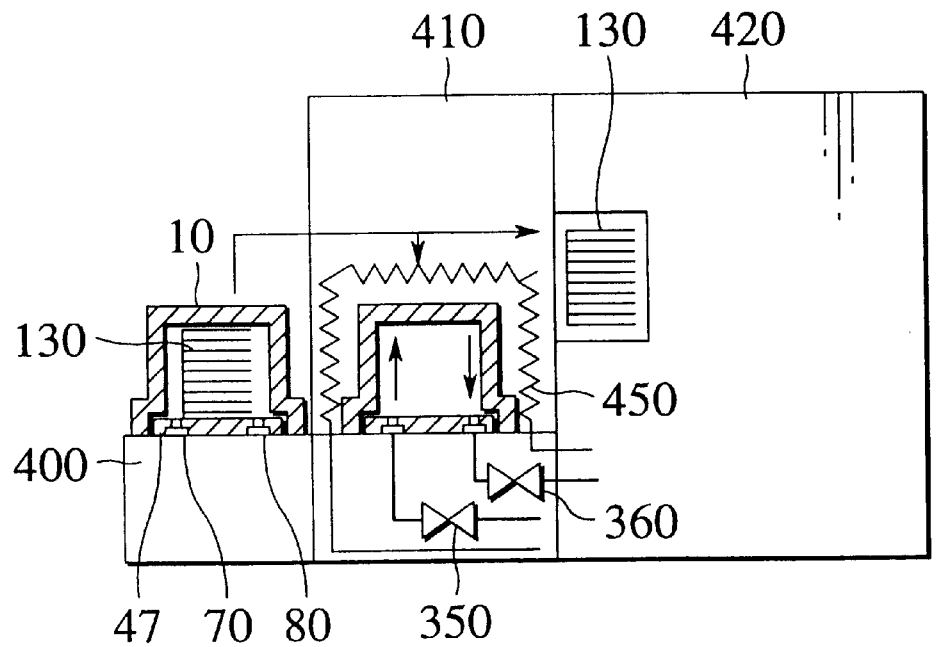

FIG. 17A shows a semiconductor processing apparatus according to an embodiment 9-3 of the present invention and a series of processes carried out thereby. The apparatus has a pod reception chamber 400, a pod processing chamber 410, and a wafer processing chamber 420. A pod handled by the apparatus consists of a pod body 10 and a cover 47. The pod body 10 has an open bottom, and the cover 47 has an inlet 70 and an outlet 80. The embodiment 9-3 is characterized by a heater 450 arranged in the pod processing apparatus 410, to surround the pod.

The heater 450 heats the pod and a washing liquid in the pod, to improve the washing power of the washing liquid. The heater 450 may heat pure water to rinse the pod. Heated waterdrops in the pod speedily dry to shorten a drying time. The heater 450 may be used to dry remnants in a washed pod.

(Embodiment 9-4)

Figure 17B:
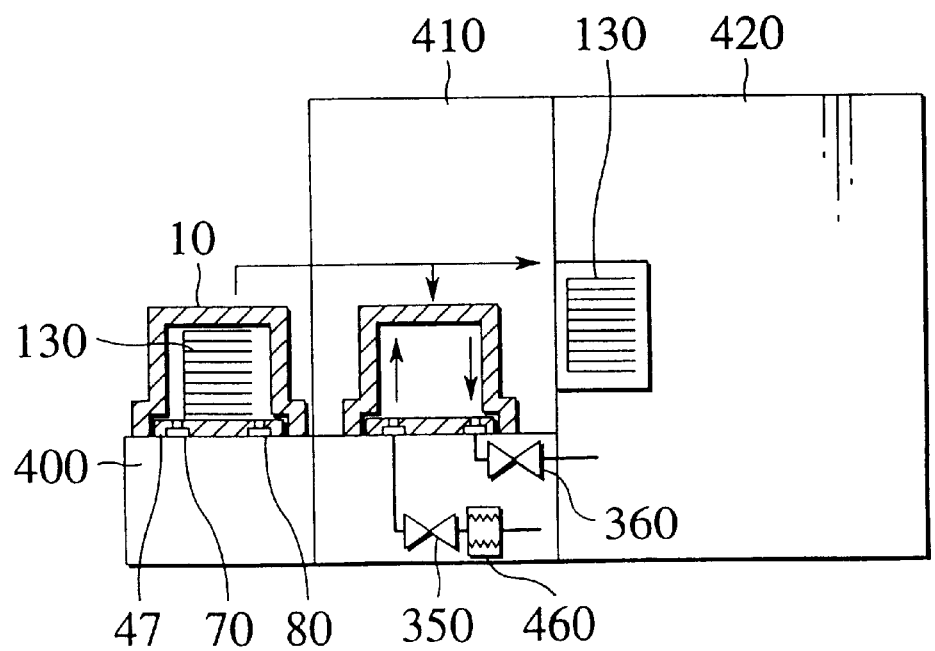

FIG. 17B shows a semiconductor processing apparatus according to an embodiment 9-4 of the present invention and a series of processes carried out thereby. The apparatus has a pod reception chamber 400, a pod processing chamber 410, and a wafer processing chamber 420. A pod handled by the apparatus consists of a pod body 10 and a cover 47. The pod body 10 has an open bottom, and the cover 47 has an inlet 70 and an outlet 80. The embodiment 9-4 is characterized by a valve 350 and a heater 460 both arranged in the middle of a pipe connected to the inlet 70.

The heater 460 surrounds a part of the pipe to heat a washing liquid passing through the pipe, thereby improving the washing power of the washing liquid. The heater 460 may heat a rinsing liquid such as pure water to rinse the inside of the pod. Waterdrops in the pod dry speedily to shorten a drying time.

(Embodiment 9-5)

Figure 18A:
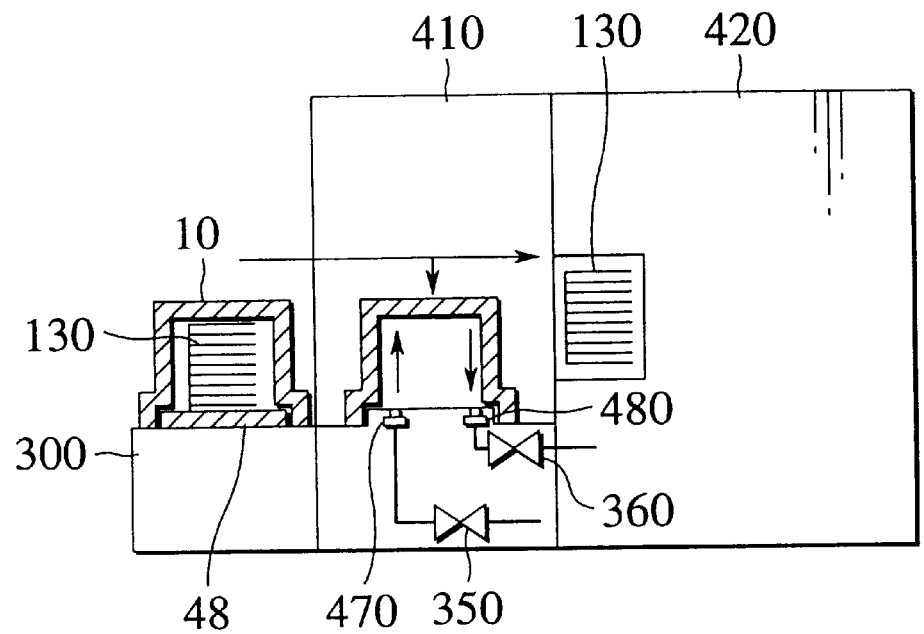

FIG. 18A shows a semiconductor processing apparatus according to an embodiment 9-5 of the present invention and a series of processes carried out thereby. The apparatus has a pod reception chamber 400, a pod processing chamber 410, and a wafer processing chamber 420. A pod handled by the apparatus consists of a pod body 10 and a cover 48. The pod body 10 has an open bottom, and the cover 48 is a conventional one having no inlet or outlet.

In the pod processing chamber 410, the opening of the pod body 10 is directly set on a table. To tightly close the opening of the pod body 10, the table has a fitting part.

In FIG. 18A, the fitting part has the same shape as the opening of the pod body 10. The table has an inlet 470 and an outlet 480.

The inlet 470 and outlet 480 are connected to pipes to introduce fluid into the pod and discharge the same from the pod. The pipes have valves 350 and 360 to adjust the supply and discharge rates of the fluid. The embodiment 9-5 washes the inside of the pod in the same manner as the embodiment 9-1.

In this way, the table arranged in the pod processing chamber 410 has the fitting part for closing the pod body 10 on the table, the inlet 470 for introducing a washing liquid into the pod, and the outlet 480 for discharging the washing liquid from the pod. This arrangement efficiently uses the time for processing wafers, to wash the inside of the pod. Since the pod processing chamber 410 is adjacent to the wafer processing chamber 420, no labor is needed to transfer the pod between them, thereby improving workability.

Figure 19A:
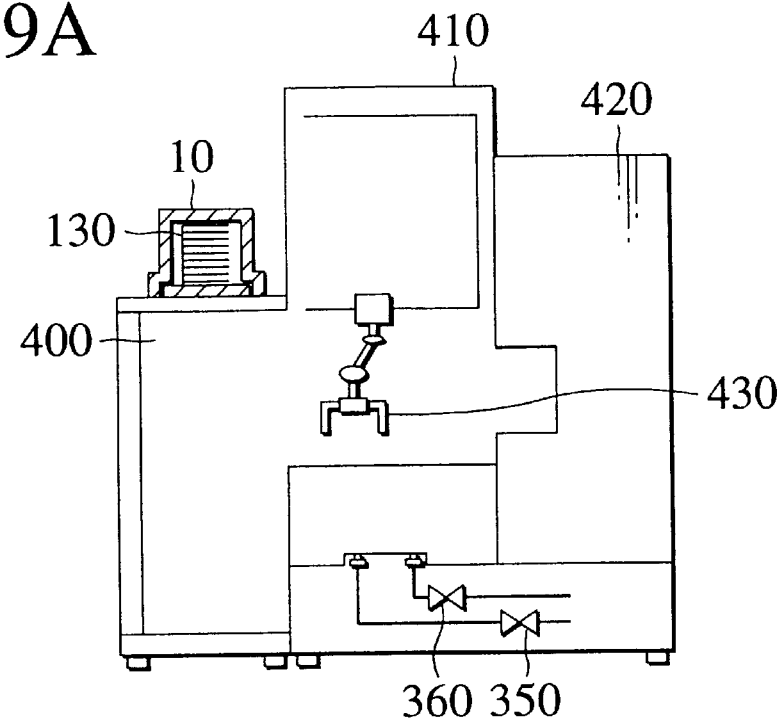
Figure 19B:
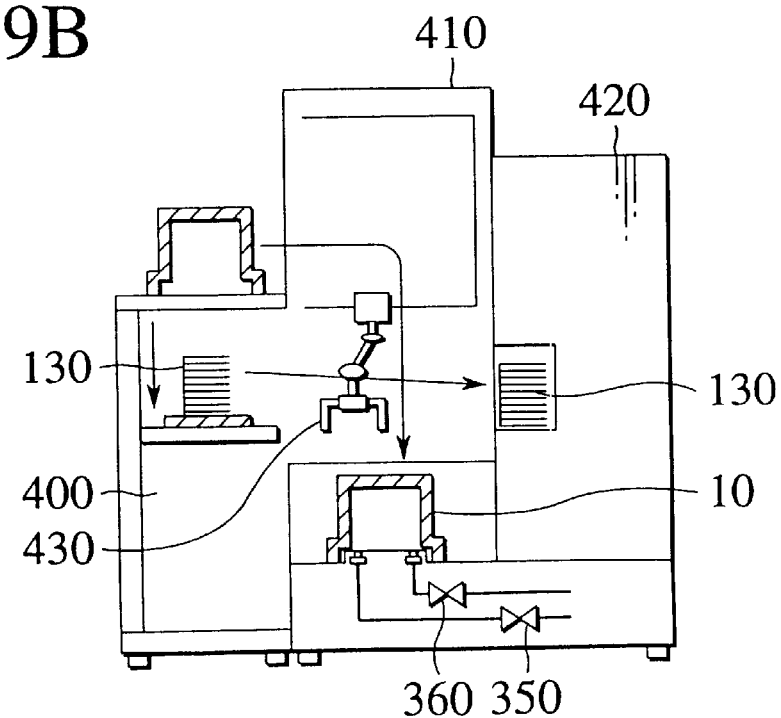

The embodiment 9-5transfers the pod and wafers as shown in FIGS. 19A and 19B.

In FIG. 19A, the pod processing chamber 410 has an arm 430 for carrying a pod or a wafer cassette.

In FIG. 19B, a pod with wafers is at a predetermined position in the pod reception chamber 400. A cover and a wafer cassette 130 on the cover are removed from a pod body 10 and are put on a table that is vertically movable. The table is moved downwardly for a predetermined distance. The arm 430 carries the wafer cassette 130 with the wafers from the pod reception chamber 400 to the wafer processing chamber 420 through the pod processing chamber 410.

The pod body 10 is transferred from the pod reception chamber 400 to the pod processing chamber 410 by, for example, a belt conveyor arranged in the pod reception chamber 400. Th arm 430 sets the pod body 10 to a predetermined position on the table in the pod processing chamber 410.

(Embodiment 9-6)

Figure 18B:
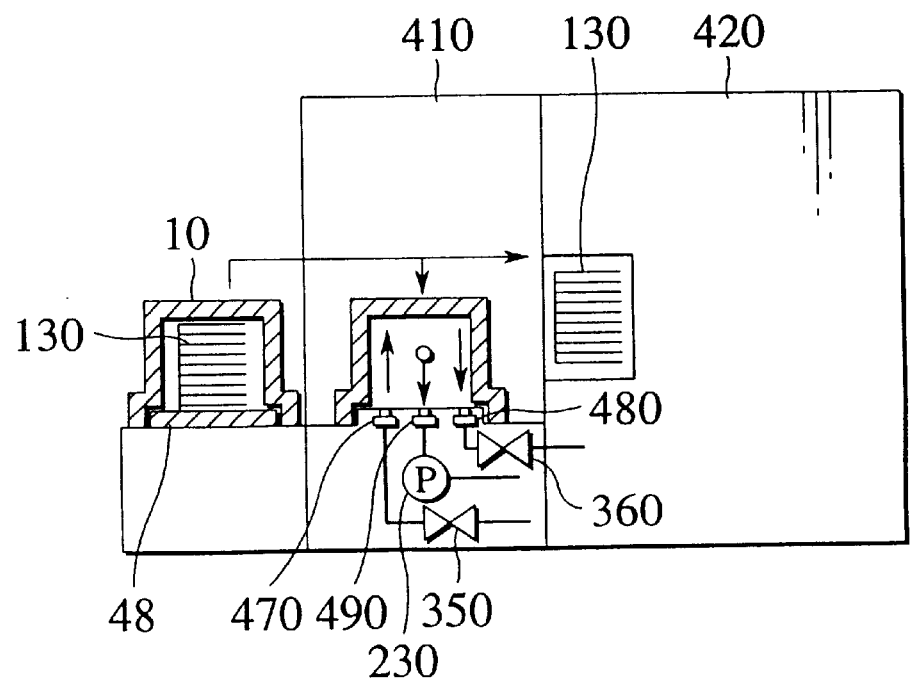

FIG. 18B shows a semiconductor processing apparatus according to an embodiment 9-6 of the present invention and a series of processes carried out thereby. The apparatus has a pod reception chamber 400, a pod processing chamber 410, and a wafer processing chamber 420. A pod handled by the apparatus consists of a pod body 10 and a cover 48. The pod body 10 has an open bottom, and the cover 48 is a conventional one having no inlet or outlet.

The pod body 10 is directly set on a table in the pod processing chamber 410. The table is shaped to tightly close the bottom opening of the pod body 10.

The table has an inlet 470, a first outlet 480, and a second outlet 490. The outlet 490 is connected to a vacuum pump 230 to evacuate the pod.

The inlet 470 and outlet 480 are used to wash the inside of the pod, and the outlet 490 and pump 230 are used to evacuate the washed inside of the pod, thereby removing remnants from the pod in a short time.

The mechanisms for transferring the pod and wafers are the same as those of FIGS. 19A and 19B.

(Embodiment 9-7)

Figure 20A:
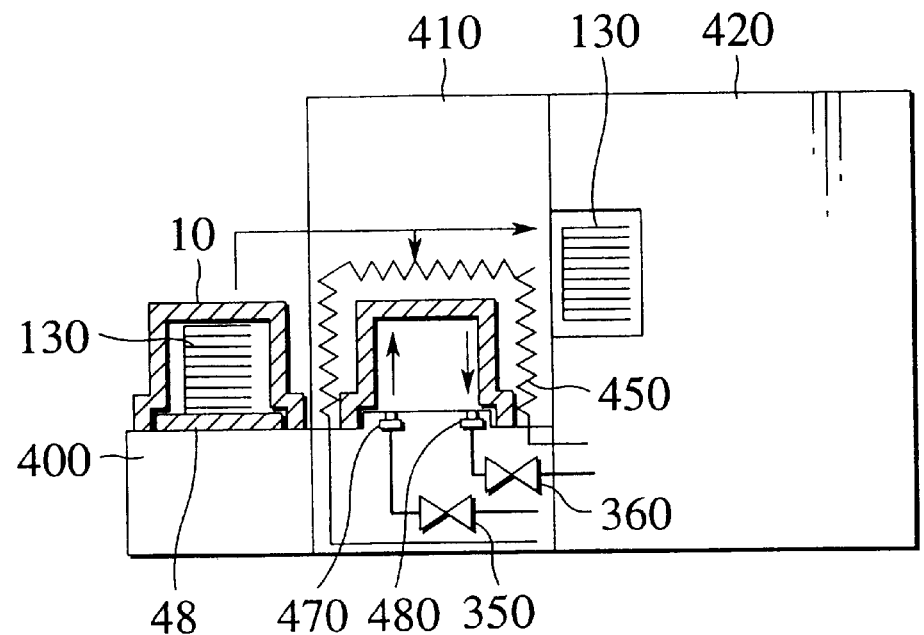

FIG. 20A shows a semiconductor processing apparatus according to an embodiment 9-7 of the present invention and a series of processes carried out thereby. The apparatus has a pod reception chamber 400, a pod processing chamber 410, and a wafer processing chamber 420. A pod handled by the apparatus consists of a pod body 10 and a cover 48. The pod body 10 has an open bottom, and the cover 48 is a conventional one having no inlet or outlet.

In the pod processing chamber 410, the pod body 10 is directly set on a table. The table has a fitting part for tightly closing the pod body 10. The table has an inlet 470 and an outlet 480.

The pod processing chamber 410 has a heater 450 to surround the pod body 10. The inlet 470 and outlet 480 are used to wash the inside of the pod body 10. At this time, the heater 450 is turned on to heat a washing liquid and improve the washing power thereof. After the washing of the pod body 10, the heater 450 may be turned on to heat the pod body 10 and dry remnants in the pod body 10 in a short time.

(Embodiment 9-8)

Figure 20B:
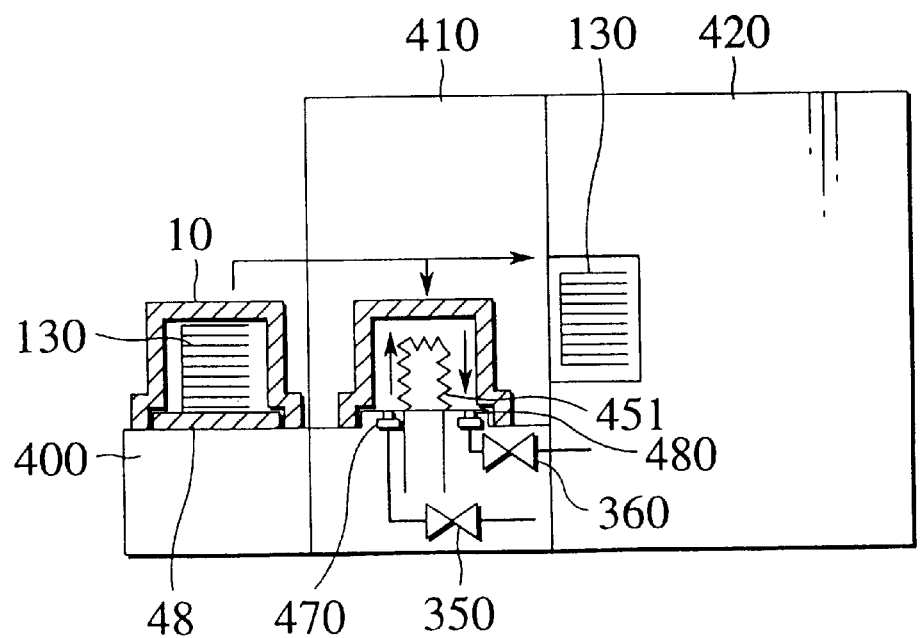

FIG. 20B shows a semiconductor processing apparatus according to an embodiment 9-8 of the present invention and a series of processes carried out thereby. The apparatus has a pod reception chamber 400, a pod processing chamber 410, and a wafer processing chamber 420. A pod handled by the apparatus consists of a pod body 10 and a cover 48. The pod body 10 has an open bottom, and the cover 48 is a conventional one having no inlet or outlet.

In the pod processing chamber 410, the pod body 10 is directly set on a table. The table has a fitting part for tightly closing the pod body 10, an inlet 470, an outlet 480, and a heater 451 to be entirely received in the pod body 10.

The inlet 470 and outlet 480 are used to wash the inside of the pod body 10. At this time, the heater 451 is turned on to heat a washing liquid and improve the washing power thereof. The heater 451 may be turned on after the washing of the pod body 10, to dry remnants in the pod body in a short time.

(Embodiment 9-9)

Figure 21A:
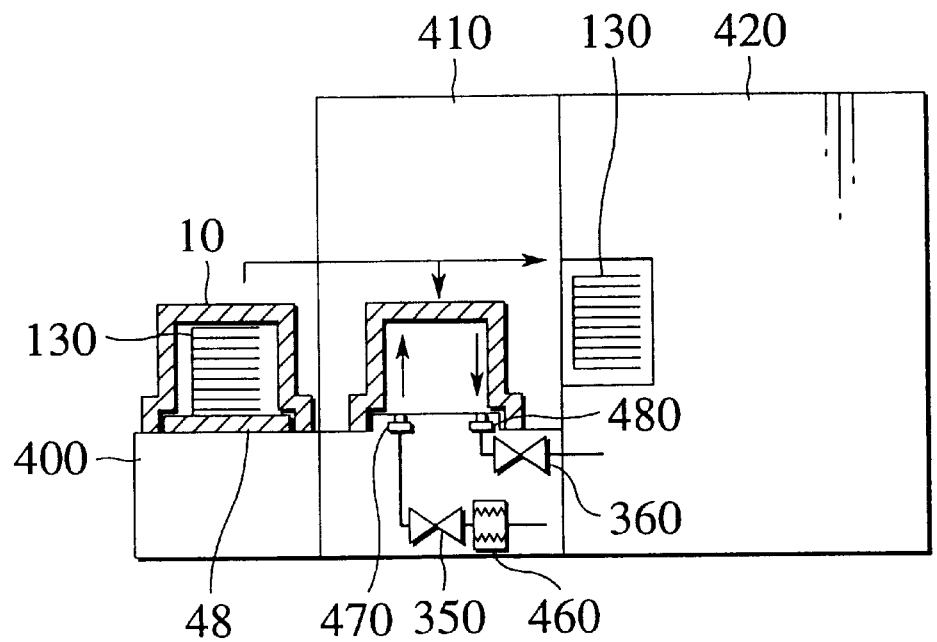

FIG. 21A shows a semiconductor processing apparatus according to an embodiment 9-9 of the present invention and a series of processes carried out thereby. The apparatus has a pod reception chamber 400, a pod processing chamber 410, and a wafer processing chamber 420. A pod handled by the apparatus consists of a pod body 10 and a cover 48. The pod body 10 has an open bottom, and the cover 48 is a conventional one having no inlet or outlet.

In the pod processing chamber 410, the pod body 10 is directly set on a table. The table has a fitting part for tightly closing the opening of the pod body 10. The table has an inlet 470 and an outlet 480, which are connected to pipes. A part of the pipe that is connected to the inlet 470 is covered with a heater 460.

The inlet 470 and outlet 480 are used to wash the inside of the pod body 10. At this time, the heater 460 heats a washing liquid to improve the washing power thereof and shorten a drying time of the washing liquid in the pod body 10.

(Embodiment 9-10)

Figure 21B:
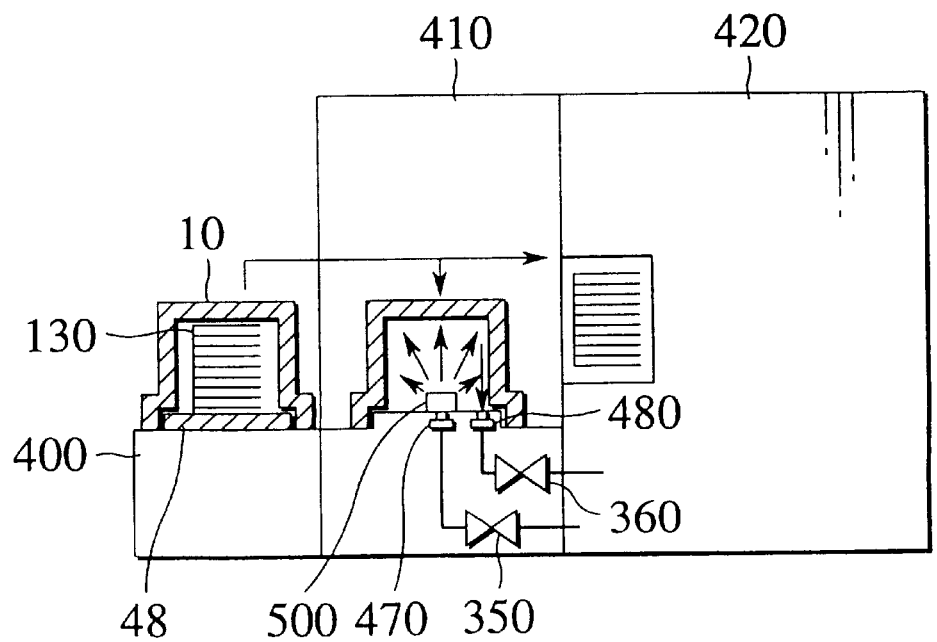

FIG. 21B shows a semiconductor processing apparatus according to an embodiment 9-10 of the present invention and a series of processes carried out thereby. The apparatus has a pod reception chamber 400, a pod processing chamber 410, and a wafer processing chamber 420. A pod handled by the apparatus consists of a pod body 10 and a cover 48. The pod body 10 has an open bottom, and the cover 48 is a conventional one having no inlet or outlet.

In the pod processing chamber 410, the pod body 10 is directly set on a table. The table has an inlet 470, an outlet 480, and a fitting part for tightly closing the opening of the pod body 10. An end of the inlet 470 is provided with a nozzle 500.

The nozzle 500 jets liquid into the pod body 10, to realize high washing power. The tip of the nozzle 500 may be narrowed as shown in FIG. 6C.

(Embodiment 9-11)

Figure 22A:
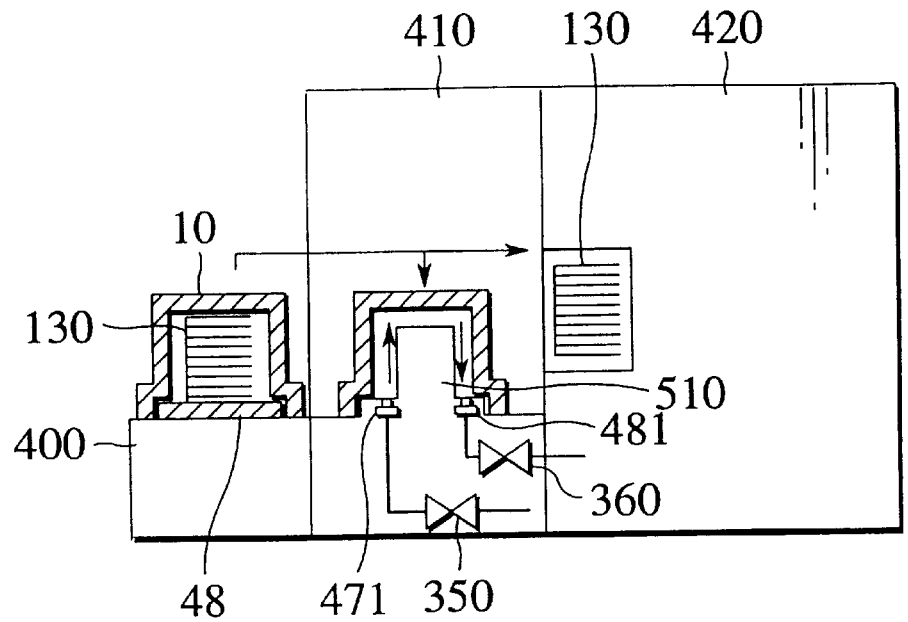

FIG. 22A shows a semiconductor processing apparatus according to an embodiment 9-11 of the present invention and a series of processes carried out thereby. The apparatus has a pod reception chamber 400, a pod processing chamber 410, and a wafer processing chamber 420. A pod handled by the apparatus consists of a pod body 10 and a cover 48. The pod body 10 has an open bottom, and the cover 48 is a conventional one having no inlet or outlet.

In the pod processing chamber 410, the pod body 10 is directly set on a table. The table has a projection 510 entering into the pod body 10. The table has an inlet 471 and an outlet 481 at the periphery of the projection 510.

The projection 510 reduces the inner volume of the pod body 10, so that the inside of the pod body 10 can efficiently be washed with a small quantity of washing liquid.

(Embodiment 9-12)

Figure 22B:
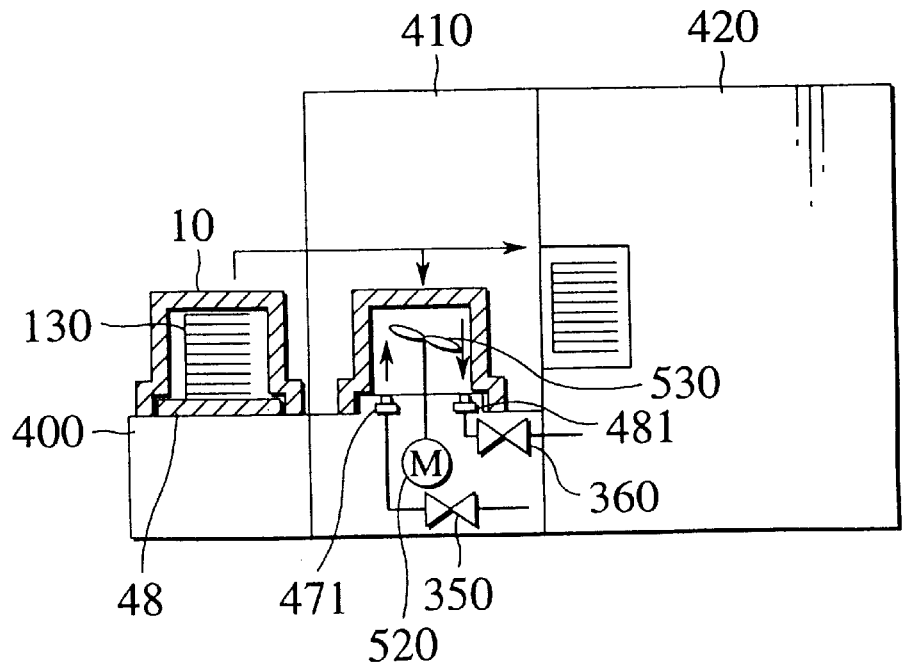

FIG. 22B shows a semiconductor processing apparatus according to an embodiment 9-12 of the present invention and a series of processes carried out thereby. The apparatus has a pod reception chamber 400, a pod processing chamber 410, and a wafer processing chamber 420. A pod handled by the apparatus consists of a pod body 10 and a cover 48. The pod body 10 has an open bottom, and the cover 48 is a conventional one having no inlet or outlet.

In the pod processing chamber 410, the pod body 10 is directly set on a table, which is provided with an agitating fin 530.

The fin 530 agitates a washing liquid filled in the pod body 10, to improve the washing power thereof.

(Embodiment 9-13)

Figure 23:
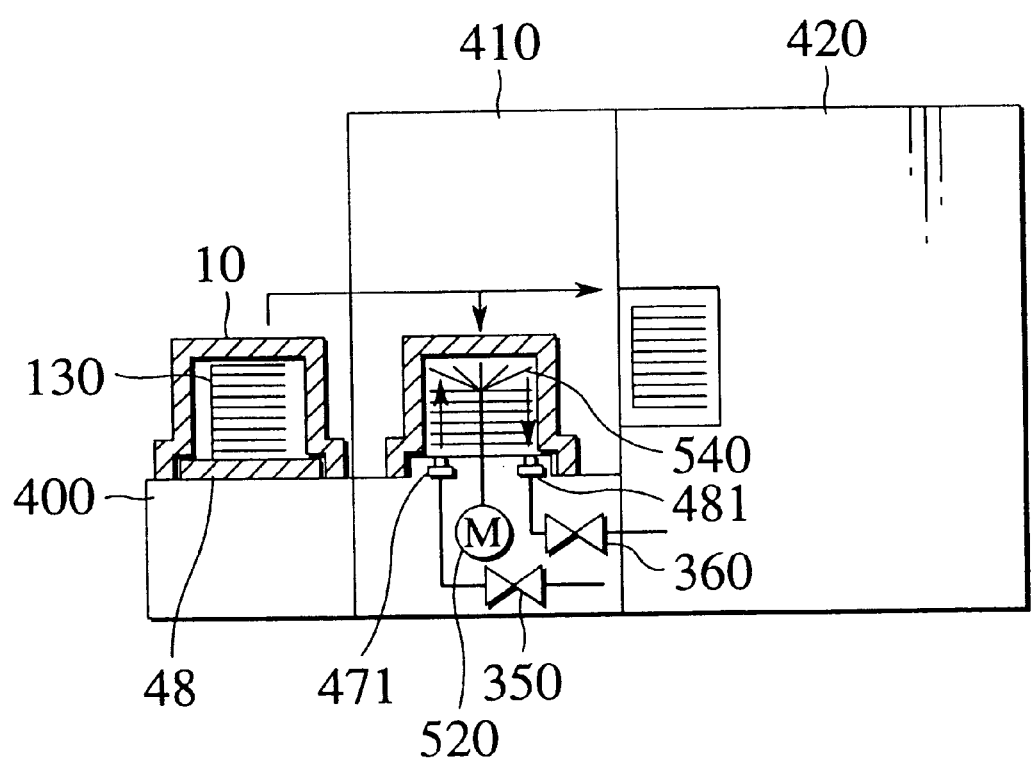

FIG. 23 shows a semiconductor processing apparatus according to an embodiment 9-13 of the present invention and a series of processes carried out thereby. The apparatus has a pod reception chamber 400, a pod processing chamber 410, and a wafer processing chamber 420. A pod handled by the apparatus consists of a pod body 10 and a cover 48. The pod body 10 has an open bottom, and the cover 48 is a conventional one having no inlet or outlet.

In the pod processing chamber 410, the pod body 10 is directly set on a table, which is provided with a rotary brush 540.

When the inside of the pod is washed, the brush 540 is used to improve washing power.

(Embodiment 9-14)

Figure 24A:
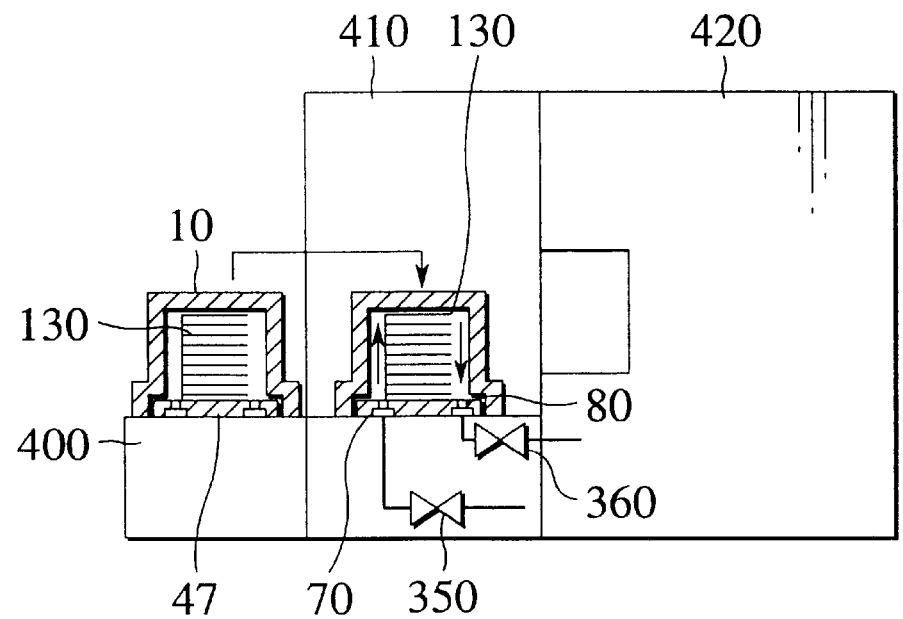

FIG. 24A shows a semiconductor processing apparatus according to an embodiment 9-14 of the present invention and a series of processes carried out thereby. This embodiment is based on the embodiment 9-1 of FIG. 15A. Namely, the apparatus has a pod reception chamber 400, a pod processing chamber 410, and a wafer processing chamber 420. A pod handled by the apparatus consists of a pod body 10 and a cover 47 having an inlet 70 and an outlet 80. In the pod processing chamber 410, the pod body 10 and the cover 47 are tightly fitted together to close the pod.

The inlet 70 and outlet 80 are connected to pipes through which a washing liquid is introduced into the pod and discharged therefrom, thereby washing the inside of the pod. At this time, wafers are left in the pod.

The pod and wafers are simultaneously washed in the pod processing chamber 410, and then, the wafers are taken out of the pod and are transferred to the wafer processing chamber 420. Namely, the chamber 420 can process the wafers that have been washed and clean.

The other embodiments mentioned above may also simultaneously wash a pod and wafers stored therein if a space left in the pod is sufficient to hold the wafers. Simultaneously washing a pod and wafers and transferring the washed wafers to the wafer processing chamber 420 improves the yield of semiconductor products to be produced from the wafers.

The wafer processing chamber 420 forms thin films such as silicon oxide films and silicon films on the wafers and patterns the thin films by, for example, photolithography. In this case, the cleanliness of the surface of each wafer greatly influences the characteristics and yield of the thin films to be formed and processed. Accordingly, washing wafers just before processing them is effective to form quality thin films thereon.

If the wafer processing chamber 420 etches a film on the wafers, the pod and wafers may simultaneously be washed as mentioned above after the completion of the etching process.

(Embodiment 9-15)

Figure 24B:
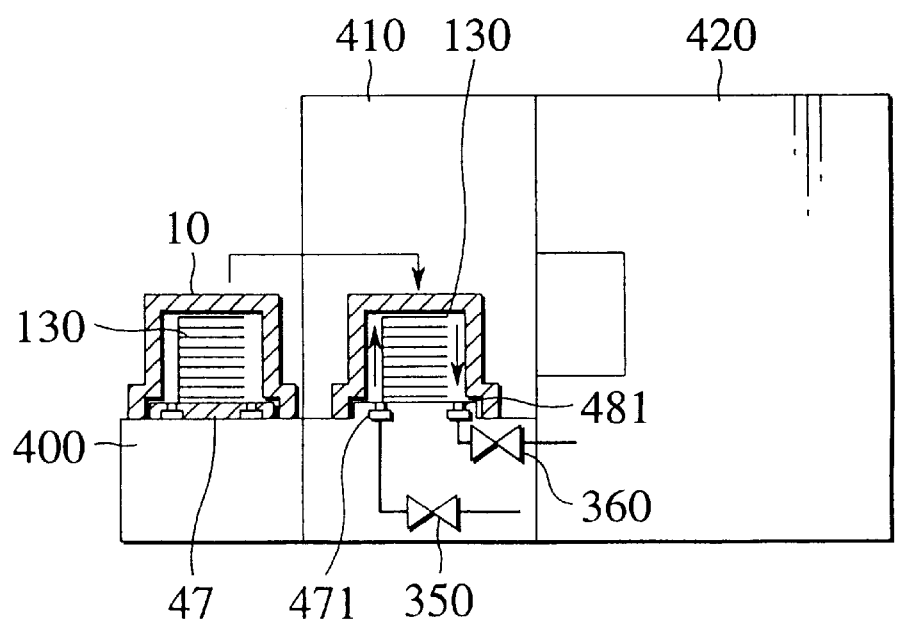
Figure 25A:
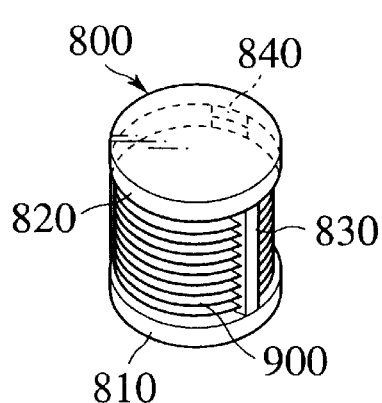
FIGS. 25A to 25D are perspective views showing wafer cassettes and pods according to prior arts.
Figure 25B:
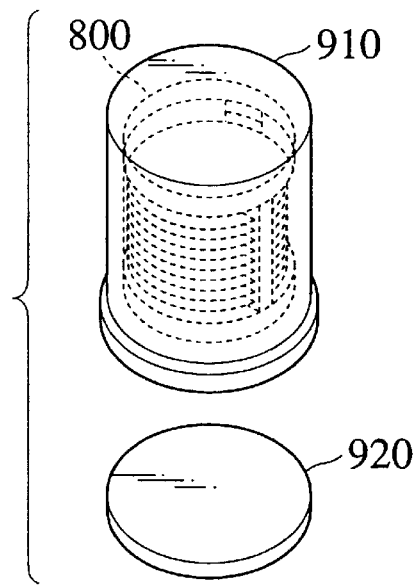
Figure 25C:
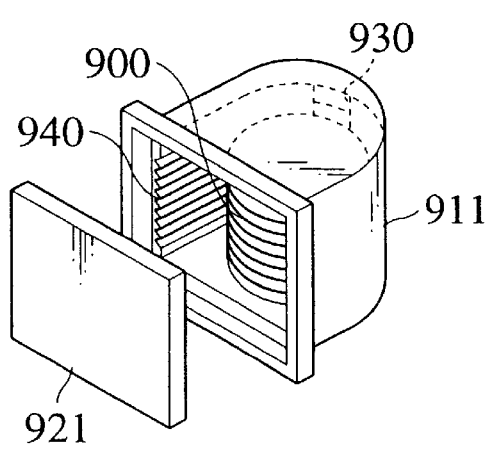
Figure 25D:
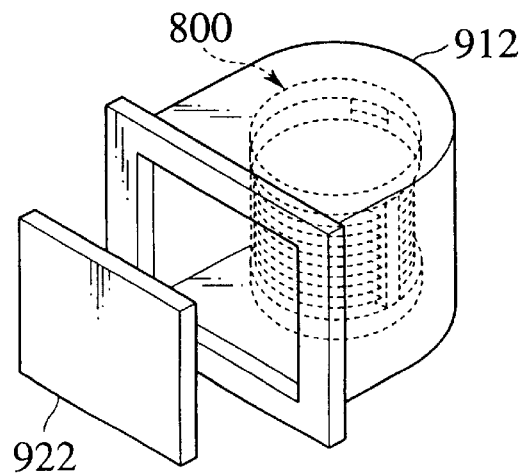
Figure 26A:
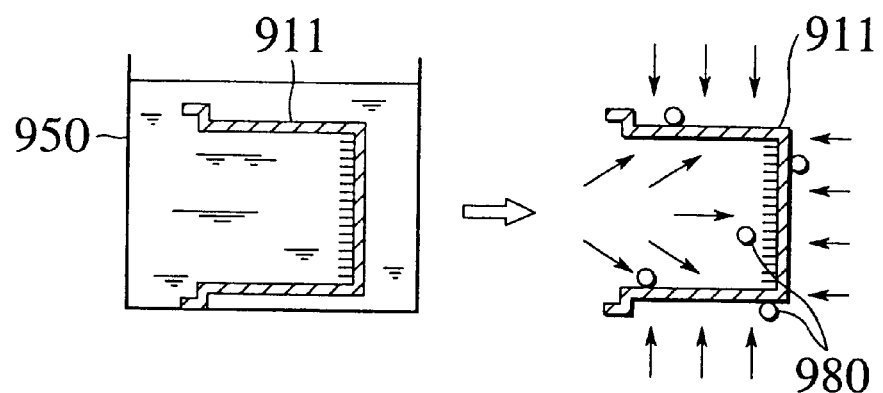
FIGS. 26A and 26B are sectional views showing a pod washing process and a pod washing apparatus according to prior arts.
Figure 26B:
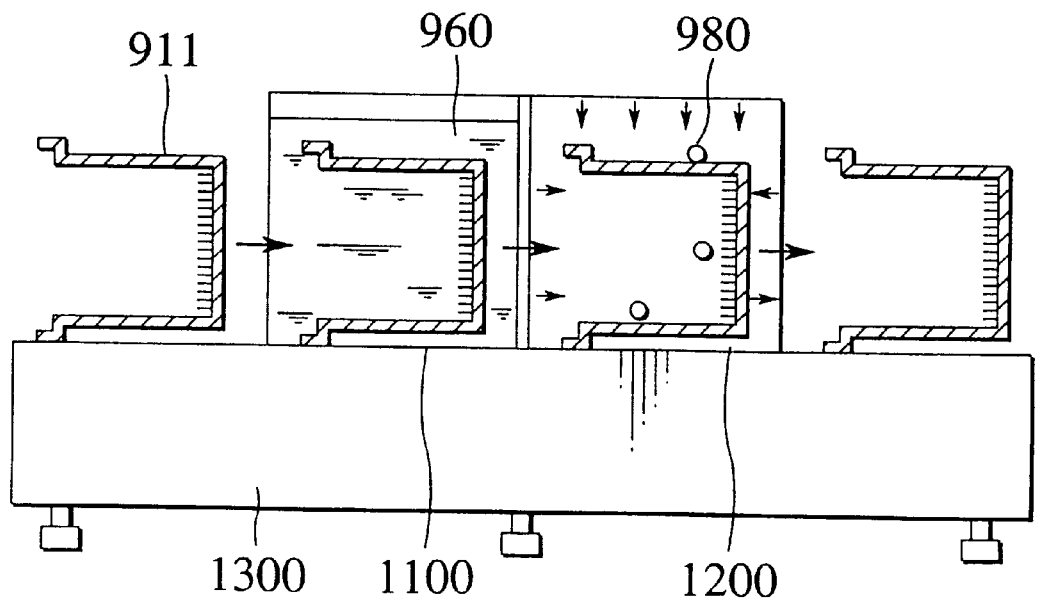

FIG. 24B shows a semiconductor processing apparatus according to an embodiment 9-15 of the present invention and a series of processes carried out thereby. This embodiment is based on the embodiment 9-5 of FIG. 18A. Namely, the apparatus has a pod reception chamber 400, a pod processing chamber 410, and a wafer processing chamber 420. A pod handled by the apparatus consists of a pod body 10 and a cover 48. The pod body 10 has an open bottom, and the cover 48 is a conventional one having no inlet or outlet. The pod processing chamber 410 has a table on which the pod body 10 is directly set. At this time, the pod body 10 is holding wafers, and the pod body 10 and wafers are simultaneously washed.

In the pod processing chamber 410, the pod body 10 is tightly fixed to the table. A washing liquid is introduced into and discharged from the pod body 10 through an inlet 471 and an outlet 481 formed on the table, thereby washing the inside of the pod body 10. At this time, the wafers in the pod body 10 are also washed.

The washed wafers are taken out of the pod body 10 and are transferred to the wafer processing chamber 420. Processing the clean wafers improves the yield of semiconductor products to be produced from the wafers. The embodiment is particularly effective when forming thin films such as silicon oxide films and silicon films on the wafers because the cleanliness of the surface of each wafer greatly influences the yield of the thin films.

Although the embodiments 9-1 to 9-15 handle pods having a bottom opening, they can also handle pods having a side opening by changing the mechanisms for transferring a pod. The structure for attaching a pod body to the table in the pod processing chamber 410 may have any design.

The wafer processing chamber 420 may contain various semiconductor processing units including plasma CVD apparatuses, spattering apparatuses, and thermal CVD apparatuses for forming insulation films, semiconductor films, and conductive films, as well as ion injection apparatuses, thermal diffusion apparatuses, and dry etching apparatuses.

Various modifications will become possible for those skilled in the art after receiving the teachings of the present disclosure without departing from the scope thereof.

Wafers and substrates stored in the pods may be silicon wafers, sapphire substrates, GaAs substrates, glass substrates, etc.

What is claimed is:

1. An apparatus for processing substrates stored in a pod including a pod body having an opening for taking in and out the substrates and a cover for closing the opening of the pod body, comprising:

a pod reception chamber;

a pod processing chamber;

a substrate processing chamber;

means for transferring the pod and substrates between the chambers;

substrate taking means in the pod reception chamber, for taking the substrates out of the pod;

cleaning means in the pod processing chamber, for cleaning the inside of the pod; and substrate processing means in the substrate processing chamber for forming or etching films such as semiconductor films, insulation films, and conductive films on the substrates.

2. An apparatus for processing substrates stored in a pod including a pod body having an opening for taking in and out the substrate and a cover for closing the opening of the pod body, comprising:

a pod reception chamber;

a pod processing chamber;

a substrate processing chamber;

means for transferring the pod and substrates between the chambers;

substrate taking means in the pod reception chamber, for taking the substrates out of the pod;

cleaning means in the pod processing chamber, for cleaning the inside of the pod; and substrate processing means in the substrate processing chamber, for processing the substrate, wherein the cover has an outlet; and the cleaning means has closing means for tightly closing the opening of the pod body with the cover, introducing means for introducing a washing liquid into the pod through the inlet, and discharging means for discharging the washing liquid from the pod through the outlet.

3. The apparatus of claim 2, wherein:

the cleaning means has heating means for heating the inside of the pod.

4. The apparatus of claim 2, wherein:

the cleaning means has heating means for heating the washing liquid to be introduced into the pod.

5. An apparatus for processing substrates stored in a pod including a pod body having an opening for taking in and out the substrate and a cover for closing the opening of the pod body, comprising:

a pod reception chamber;

a pod processing chamber;

a substrate processing chamber;

means for transferring the pod and substrates between the chambers;

substrate taking means in the pod reception chamber, for taking the substrates out of the pod;

cleaning means in the pod processing chamber, for cleaning the inside of the pod; and substrate processing means in the substrate processing chamber, for processing the substrate, wherein the cover has an outlet; and the cleaning means has evacuating means for evacuating the pod through the outlet.

6. An apparatus for processing substrates stored in a pod including a pod body having an opening for taking in and out the substrate and a cover for closing the opening of the pod body, comprising:

a pod reception chamber;

a pod processing chamber;

a substrate processing chamber;

means for transferring the pod and substrates between the chambers;

substrate taking means in the pod reception chamber, for taking the substrates out of the pod;

cleaning means in the pod processing chamber, for cleaning the inside of the pod; and substrate processing means in the substrate processing chamber, for processing the substrate, wherein the cleaning means has:

a table on which the pod body is set to tightly close the inside of the pod body;

an inlet and an outlet formed on the table, the inlet introducing fluid into the pod body, the outlet discharging fluid from the pod body;

introducing means for introducing a washing liquid into the pod body through inlet; and discharging means for discharging the washing liquid from the pod body through the outlet.

7. The apparatus of claim 6, wherein the table has:

a second outlet; and evacuating means for evacuating the pod body through the second outlet.

8. The apparatus of claim 6, wherein:

the cleaning means is provided with heating means for heating the pod body.

9. The apparatus of claim 6, wherein:

the cleaning means is provided with heating means for heating the washing liquid to be introduced into the pod body through the inlet.

10. The apparatus of claim 6, wherein:

the inlet has at least one nozzle for jetting the washing liquid into the pod body.

11. The apparatus of claim 6, wherein:

the table has a projection protruding into the pod body.

12. The apparatus of claim 6, wherein the table has:

at least one of a fin for agitating fluid in the pod body and a brush for washing the inside of the pod body; and driving means for driving the fin and brush.

* * * * *